(12) United States Patent
Huang

(10) Patent No.: US 11,302,619 B2
(45) Date of Patent: Apr. 12, 2022

(54) DEVICE STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 121 days.

(21) Appl. No.: 16/590,173

(22) Filed: Oct. 1, 2019

(65) Prior Publication Data
US 2021/0098357 A1   Apr. 1, 2021

(51) Int. Cl.
| | |
|---|---|
| *H01L 21/48* | (2006.01) |
| *H01L 23/498* | (2006.01) |
| *H05K 1/11* | (2006.01) |
| *H01L 49/02* | (2006.01) |
| *H01L 23/00* | (2006.01) |
| *H01L 23/31* | (2006.01) |
| *H01L 25/16* | (2006.01) |
| *H05K 1/18* | (2006.01) |
| *H05K 1/16* | (2006.01) |

(52) U.S. Cl.
CPC ...... *H01L 23/49838* (2013.01); *H01L 21/486* (2013.01); *H01L 21/4857* (2013.01); *H01L 23/3121* (2013.01); *H01L 23/49822* (2013.01); *H01L 24/16* (2013.01); *H01L 25/16* (2013.01); *H01L 28/60* (2013.01); *H05K 1/113* (2013.01); *H05K 1/162* (2013.01); *H05K 1/181* (2013.01); *H01L 2224/16227* (2013.01); *H01L 2924/19041* (2013.01); *H05K 2201/0195* (2013.01); *H05K 2201/10734* (2013.01)

(58) Field of Classification Search
CPC .................................................... H01L 21/486
See application file for complete search history.

(56) References Cited

U.S. PATENT DOCUMENTS

| | | | |
|---|---|---|---|
| 2009/0141426 A1* | 6/2009 | Hwang | H01L 21/8221 361/321.2 |
| 2010/0246089 A1* | 9/2010 | Yano | H01G 4/0085 361/306.1 |
| 2018/0040422 A1* | 2/2018 | Shin | H01L 28/60 |
| 2019/0295772 A1* | 9/2019 | Shin | H01G 4/33 |

FOREIGN PATENT DOCUMENTS

JP    5374814 B2    12/2013

* cited by examiner

*Primary Examiner* — Douglas M Menz
(74) *Attorney, Agent, or Firm* — Foley & Lardner LLP

(57) ABSTRACT

A device structure includes a stacked structure, a dielectric material, and an electrode via. The stacked structure includes a first metal oxide layer, a second metal oxide layer and a metal layer. The second metal oxide layer is opposite to the first metal oxide layer. The metal layer is interposed between the first metal oxide layer and the second metal oxide layer. The dielectric material extends through the first metal oxide layer. The electrode via extends through the dielectric material and electrically connected to the metal layer.

19 Claims, 25 Drawing Sheets

DEVICE STRUCTURE AND METHOD FOR MANUFACTURING THE SAME

BACKGROUND

1. Field of the Disclosure

The present disclosure relates to a device structure and a manufacturing method, and to a device structure including an electrode via and a method for manufacturing the device structure.

2. Description of the Related Art

Embeddable passive component fabrication is generally based on a multi-layer material. For example, the multi-layer material may be used to form an embedded capacitor. In order to form an anode and a cathode of the embedded capacitor, many through holes are formed to form conductive vias. Laser drilling is often used to form the through holes since the laser energy may penetrate a metal oxide layer and a dielectric layer of the multi-layer material. During the laser drilling, a lower opening of the through hole is formed after the laser energy penetrates the metal oxide layer, and an upper opening of the through hole is formed on the dielectric layer at the same time. However, the laser energy is too high for the dielectric layer; therefore, when the size of the lower opening reaches a desired size, the size of the upper opening will be larger than the desired size due to an upper portion of the dielectric layer is over etched by the high laser energy.

SUMMARY

In some embodiments, a device structure includes a stacked structure, a dielectric material, and an electrode via. The stacked structure includes a first metal oxide layer, a second metal oxide layer and a metal layer. The second metal oxide layer is opposite to the first metal oxide layer. The metal layer is interposed between the first metal oxide layer and the second metal oxide layer. The dielectric material extends through the first metal oxide layer. The electrode via extends through the dielectric material and is electrically connected to the metal layer.

In some embodiments, a device structure includes a stacked structure, a dielectric material, an electrode via and a first redistribution structure. The stacked structure includes a first metal oxide layer, a second metal oxide layer and a metal layer. The second metal oxide layer is opposite to the first metal oxide layer. The metal layer is interposed between the first metal oxide layer and the second metal oxide layer. The dielectric material extends through the first metal oxide layer. The electrode via extends through the dielectric material and is electrically connected to the metal layer. The first redistribution structure is disposed on and electrically connected to the stacked structure.

In some embodiments, a method for manufacturing a device structure includes: (a) providing a stacked structure including a first metal oxide layer, a second metal oxide layer opposite to the first metal oxide layer, a metal layer interposed between the first metal oxide layer and the second metal oxide layer, a first electrode structure disposed adjacent to the first metal oxide layer and a first dielectric structure covering the first electrode structure; (b) forming at least one central through hole extending through the first dielectric structure, the first electrode structure and the first metal oxide layer to expose a portion of the metal layer; (c) forming a dielectric material in the central through hole and on the exposed portion of the metal layer; (d) forming a central opening extending through the dielectric material to expose a portion of the exposed portion of the metal layer; and (e) forming an electrode via in the central opening and on the exposed portion of the metal layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
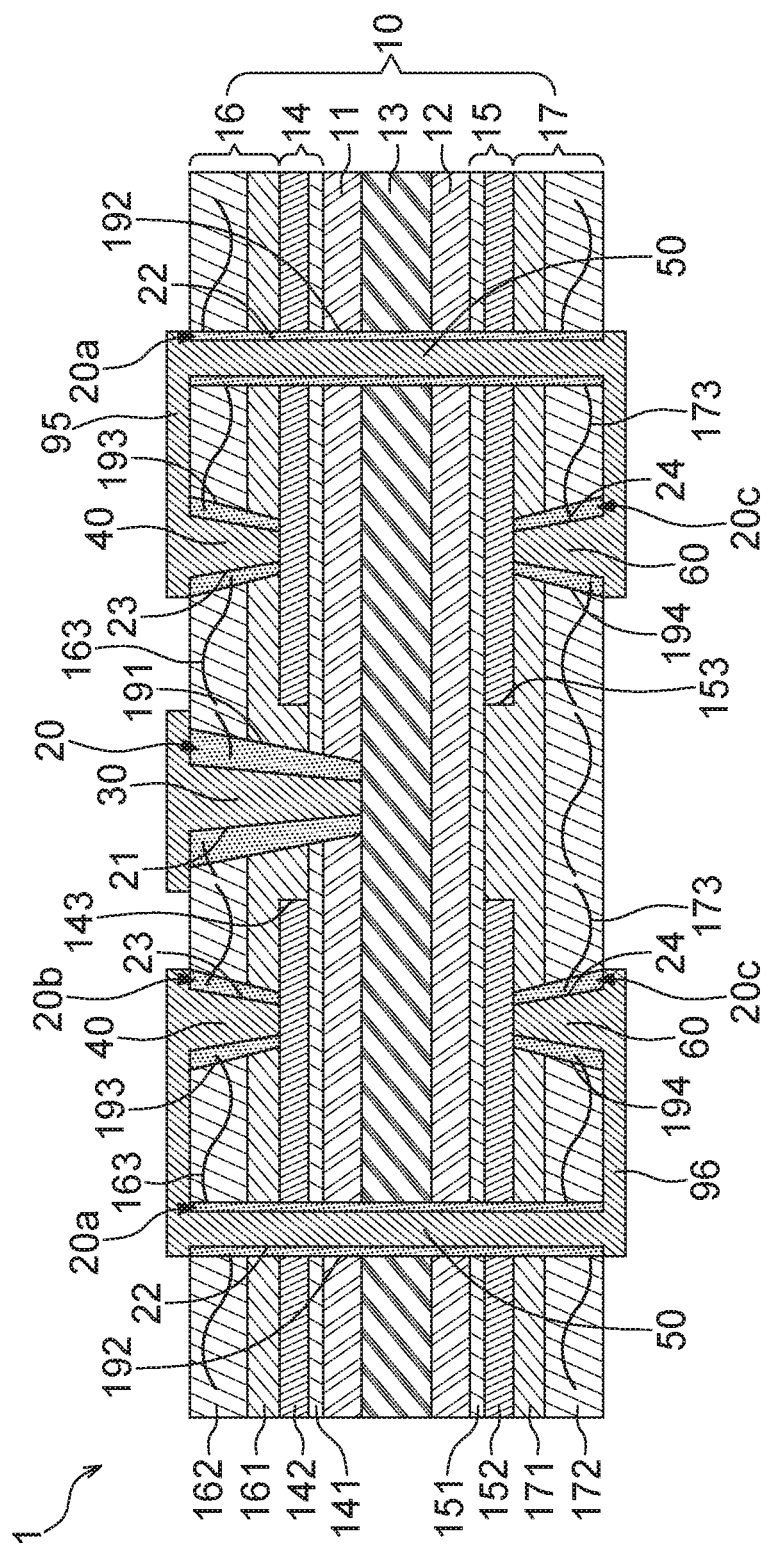
FIG. 1 illustrates a cross-sectional view of a device structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a device structure which may adjust a via size to a desired size. In some embodiments, the device structure includes an electrode via extending through a dielectric material and electrically connected to a metal layer. At least some embodiments of the present disclosure further provide for techniques for manufacturing the device structure to prevent the electrode via from being larger than the desired size.

FIG. 1 illustrates a cross-sectional view of a device structure 1 according to some embodiments of the present disclosure. The device structure 1 includes a stacked structure 10, a dielectric material (including, for example, the dielectric material 20, the dielectric material 20a, the dielectric material 20b and the dielectric material 20c), an electrode via 30, a plurality of first inner vias 40, a plurality of outer vias 50 and a plurality of second inner vias 60. In some embodiments, the device structure 1 may be a capacitor.

The stacked structure 10 includes a first metal oxide layer 11, a second metal oxide layer 12, a metal layer 13, a first electrode structure 14, a second electrode structure 15, a first dielectric structure 16 and a second dielectric structure 17. A material of the first metal oxide layer 11 may be, for example, aluminum oxide ($Al_2O_3$). The second metal oxide layer 12 is opposite to the first metal oxide layer 11. A material of the second metal oxide layer 12 may be, for example, aluminum oxide ($Al_2O_3$). The metal layer 13 is interposed between the first metal oxide layer 11 and the second metal oxide layer 12. A material of the metal layer 13 may be, for example, aluminum (Al). As shown in FIG. 1, the first metal oxide layer 11 is disposed on a top surface of the metal layer 13, and the second metal oxide layer 12 is disposed on a bottom surface of the metal layer 13.

The first electrode structure 14 is disposed adjacent to the first metal oxide layer 11. In some embodiments, the first electrode structure 14 may include an insulating layer 141 disposed on the first metal oxide layer 11 and an electrode layer 142 disposed on the insulating layer 141. A material of the insulating layer 141 may be, for example, polymer. A material of the electrode layer 142 may be, for example, copper. The electrode layer 142 may define an opening 143 extending through the electrode layer 142 to expose the insulating layer 141. The opening 143 may not extend through the insulating layer 141.

The second electrode structure 15 is disposed adjacent to the second metal oxide layer 12. In some embodiments, the second electrode structure 15 may include an insulating layer 151 disposed on the second metal oxide layer 12 and an electrode layer 152 disposed on the insulating layer 151. A material of the insulating layer 151 may be, for example, polymer. A material of the electrode layer 152 may be, for example, copper. The electrode layer 152 may define an opening 153 extending through the electrode layer 152 to expose the insulating layer 151. The opening 153 may not extend through the insulating layer 151.

The first dielectric structure 16 covers the first electrode structure 14. In some embodiments, the first dielectric structure 16 may include a first dielectric layer 161, at least one second dielectric layer 162 and a plurality of fibers 163. The first dielectric layer 161 covers the electrode layer 142 and extends into the opening 143. A material of the first dielectric layer 161 may be, for example, ajinomoto build-up film (ABF). The second dielectric layer 162 is disposed on the first dielectric layer 161. In some embodiments, a material of the second dielectric layer 162 may be different from a material of the first dielectric layer 161. The material of the second dielectric layer 162 may be, for example, polypropylene (PP). The fibers 163 (e.g., glass fibers) are embedded in the second dielectric layer 162 to improve the material strength of the second dielectric layer 162.

The second dielectric structure 17 covers the second electrode structure 15. In some embodiments, the second dielectric structure 17 may include a first dielectric layer 171, at least one second dielectric layer 172 and a plurality of fibers 173. The first dielectric layer 171 covers the electrode layer 152 and extends into the opening 153. A material of the first dielectric layer 171 may be, for example, ajinomoto build-up film (ABF). The second dielectric layer 172 is disposed on the first dielectric layer 171. In some embodiments, a material of the second dielectric layer 172 may be different from a material of the first dielectric layer 171. The material of the second dielectric layer 172 may be, for example, polypropylene (PP). The fibers 173 (e.g., glass fibers) are embedded in the second dielectric layer 172 to improve the material strength of the second dielectric layer 172.

The stacked structure 10 may define a central through hole 191, a plurality of outer through holes 192, a plurality of first inner through holes 193 and a plurality of second inner through holes 194. The central through hole 191 extends through the first dielectric structure 16, the first electrode structure 14 and the first metal oxide layer 11 to expose a portion of the metal layer 13.

In some embodiments, the opening 143 of the electrode layer 142 and the opening 153 of the electrode layer 152 may correspond to the central through hole 191. The first dielectric layer 161 of the first dielectric structure 16 and the first dielectric layer 171 of the second dielectric structure 17 may cover the opening 143 of the electrode layer 142 and the opening 153 of the electrode layer 152, respectively. As shown in FIG. 1, the central through hole 191 is disposed within the opening 143 of the electrode layer 142. In some embodiments, a portion of the fibers 163 of the first dielectric structure 16 extends into the central through hole 191. That is, an end of the fiber 163 may by exposed in the central through hole 191.

The outer through holes 192 extends through the stacked structure 10. That is, The outer through holes 192 extends through the first metal oxide layer 11, the second metal oxide layer 12, the metal layer 13, the first electrode structure 14, the second electrode structure 15, the first dielectric structure 16 and the second dielectric structure 17.

The first inner through holes 193 is located between the central through hole 191 and the outer through holes 192 and extends through the first dielectric structure 16 to expose a portion (e.g., a portion of the electrode layer 142) of the first electrode structure 14. In some embodiments, a portion of the fibers 163 of the first dielectric structure 16 extends into the first inner through holes 193. That is, an end of the fiber 163 may by exposed in the first inner through hole 193.

The second inner through holes 194 extends through the second dielectric structure 17 to expose a portion (e.g., a portion of the electrode layer 152) of the second electrode structure 15. In some embodiments, a portion of the fibers 173 of the second dielectric structure 17 extends into the second inner through holes 194. That is, an end of the fiber 163 may by exposed in the second inner through hole 194.

The dielectric material (including, for example, the dielectric material 20, 20a, 20b, 20c) is disposed in the central through hole 191, the outer through holes 192, the first inner through holes 193 and the second inner through holes 194. As shown in FIG. 1, the dielectric material 20 is disposed in the central through hole 191, the dielectric material 20a is disposed in the outer through holes 192, the dielectric material 20b is disposed in the first inner through holes 193, and the dielectric material 20c is disposed in the second inner through holes 194.

The dielectric material 20 extends through the first dielectric structure 16, the first electrode structure 14 and the first metal oxide layer 11. The dielectric material 20 covers the exposed portion of the metal layer 13 and defines a central opening 21 extending through the dielectric material 20 to expose a portion of the exposed portion of the metal layer 13. In addition, the dielectric material 20 covers the portion of the fibers 163 extending into the central through hole 191. In some embodiments, the dielectric material 20 tapers downward since the central through hole 191 tapers downward. In addition, the central opening 21 tapers downward.

The dielectric material 20a extends through the stacked structure 10 and defines an outer opening 22 extending through the dielectric material 20a in each of the outer through holes 192.

The dielectric material 20b extends through the first dielectric structure 16. The dielectric material 20b covers the exposed portion (e.g., the exposed portion of the electrode layer 142) of the first electrode structure 14 and defines a first inner opening 23 extending through the dielectric material 20b in each of the first inner through holes 193 to expose a portion of the exposed portion (e.g., the exposed portion of the electrode layer 142) of the first electrode structure 14. In addition, the dielectric material 20b covers the portion of the fibers 163 extending into the first inner through holes 193. In some embodiments, the dielectric material 20b tapers downward since the first inner through holes 193 tapers downward. In addition, the first inner opening 23 tapers downward. In some embodiments, a tapering direction of the dielectric material 20b in the first inner through holes 193 may be the same as a tapering direction of the dielectric material 20 in the central through hole 191, for example, both the dielectric material 20b and the dielectric material 20 taper downward.

The dielectric material 20c extends through the second dielectric structure 17. The dielectric material 20c covers the exposed portion (e.g., the exposed portion of the electrode layer 152) of the second electrode structure 15 and defines a second inner opening 24 extending through the dielectric material 20c in each of the second inner through holes 194 to expose a portion of the exposed portion (e.g., the exposed portion of the electrode layer 152) of the second electrode structure 15. In addition, the dielectric material 20c covers the portion of the fibers 173 extending into the second inner through holes 194. In some embodiments, a tapering direction of the dielectric material 20c in the second inner through holes 194 may be different from a tapering direction of the dielectric material 20b in the first inner through holes 193, for example, the dielectric material 20c tapers upward and the dielectric material 20b tapers downward.

During the formation of the central through hole 191, the outer through holes 192, the first inner through holes 193 and the second inner through holes 194, the sizes of the central through hole 191, the first inner through holes 193 and the second inner through holes 194 may be larger than a desired size due to an upper portion of the first dielectric structure 16 and a lower portion of the second dielectric structure 17 are over etched by the laser drilling energy or a machining tolerance. Further, the sizes of the outer through holes 192 may be larger than a desired size due to a machining error or a machining tolerance caused by mechanical drilling. The dielectric material (including, for example, the dielectric material 20, 20a, 20b, 20c) may be filled in the above mentioned through holes 191, 192, 193, 194 to adjust the sizes of the openings 21, 22, 23, 24 to the desired sizes.

The electrode via 30 is disposed in the central opening 21 and electrically connected to the exposed portion of the metal layer 13. In some embodiments, the electrode via 30 may extend through the dielectric material 20, and a tapering direction of the electrode via 30 may be the same as a tapering direction of the dielectric material 20. In some embodiments, the electrode via 30 may be an anode of the capacitor.

The first inner vias 40 are disposed in the first inner openings 23 and electrically connected to the exposed portion (e.g., the exposed portion of the electrode layer 142) of the first electrode structure 14. In some embodiments, a tapering direction of the first inner via 40 may be the same as a tapering direction of the dielectric material 20*b* in the first inner through hole 193.

The outer vias 50 are disposed in the outer openings 22 and electrically connected to the first inner vias 40. In some embodiments, the outer vias 50 may be electrically connected to the first inner vias 40 through a circuit layer 95 formed on a top surface of the first dielectric structure 16.

The second inner vias 60 are disposed in the second inner openings 24 and electrically connected to the exposed portion (e.g., the exposed portion of the electrode layer 152) of the second electrode structure 15 and the outer vias 50. In some embodiments, the second inner vias 60 may be electrically connected to the outer vias 50 through a circuit layer 96 formed on a bottom surface of the second dielectric structure 17. In some embodiments, a tapering direction of the second inner via 60 may be the same as a tapering direction of the dielectric material 20*c* in the second inner through hole 194. As shown in FIG. 1, the electrode via 30, the first inner vias 40, the outer vias 50 and the second inner vias 60 may be formed concurrently.

Since the sizes of the central through hole 191, the outer through holes 192, the first inner through holes 193 and the second inner through holes 194 may be adjusted by the dielectric material (including the dielectric material 20, the first dielectric material 20*a*, the dielectric material 20*b*, and the dielectric material 20*c*), the sizes of the electrode via 30, the first inner vias 40, the outer vias 50 and the second inner vias 60 may be reduced to reach the desired sizes. In addition, the dielectric materials 20, 20*a*, 20*b*, 20*c* may covers the exposed portion of the fibers 163, thus, the yield and quality of the electrode via 30, the first inner vias 40, the outer vias 50 and the second inner vias 60 may be improved.

In some embodiments, the first inner vias 40, the outer vias 50 and the second inner vias 60 may constitute a cathode of the capacitor.

Figure 2:
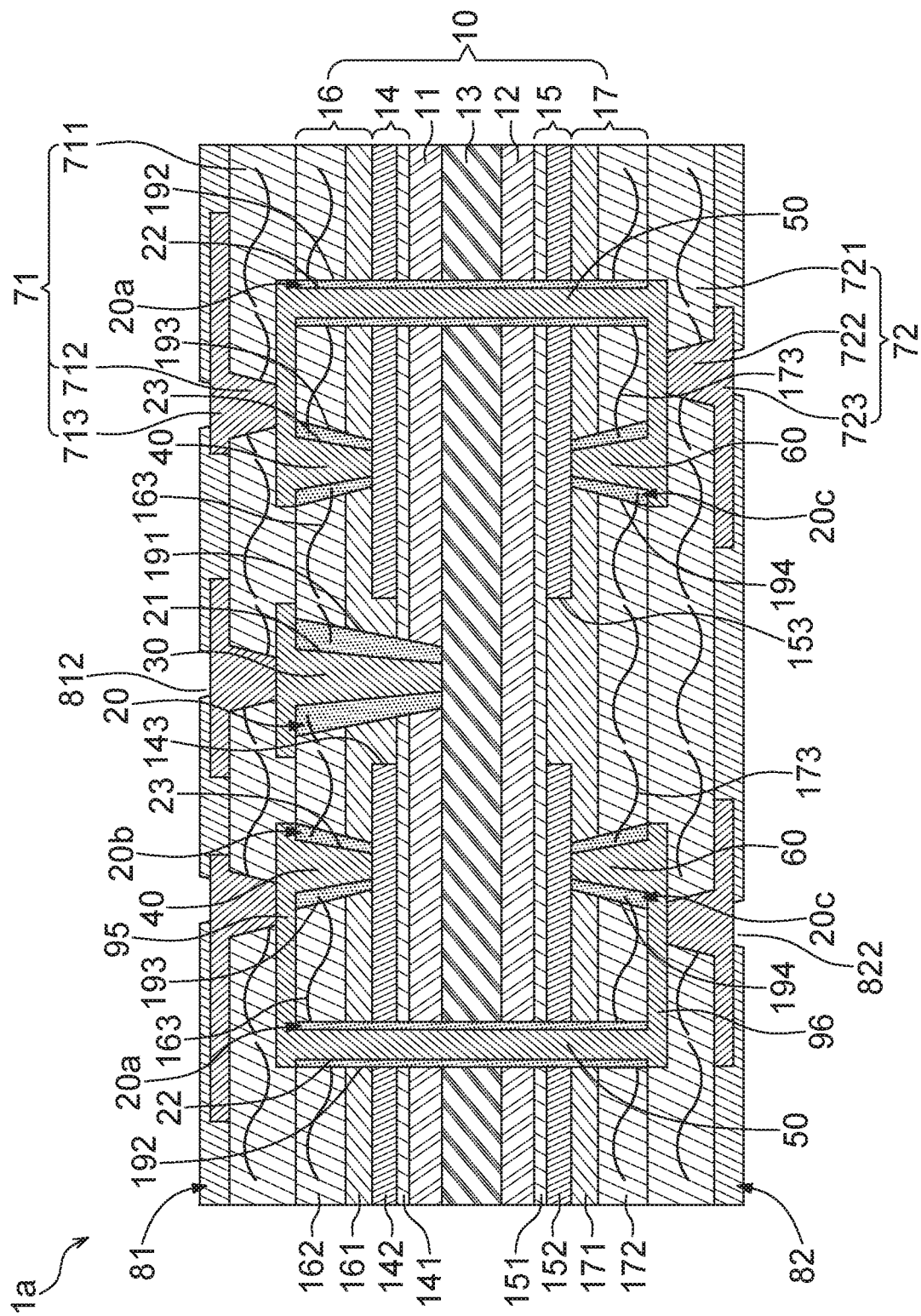
FIG. 2 illustrates a cross-sectional view of a device structure according to some embodiments of the present disclosure.

FIG. 2 illustrates a cross-sectional view of a device structure 1*a* according to some embodiments of the present disclosure. The device structure 1*a* is similar to the device structure 1 shown in FIG. 1, except that the device structure 1*a* further includes a first redistribution structure 71, a second redistribution structure 72, a first protection layer 81 and a second protection layer 82. In some embodiments, the device structure 1*a* may be a substrate including the device structure 1 (e.g., a capacitor) of FIG. 1.

The first redistribution structure 71 is disposed on and electrically connected to the stacked structure 10. In some embodiments, the first redistribution structure 71 may be disposed on the first dielectric structure 16 of the stacked structure 10 and electrically connected to the electrode via 30, the first inner vias 40 and the outer vias 50. Similarly, the second redistribution structure 72 may be disposed on the second dielectric structure 17 of the stacked structure 10 and electrically connected to the second inner vias 60 and the outer vias 50.

In some embodiments, the first redistribution structure 71 may include at least one dielectric layer 711 disposed on the first dielectric structure 16 and a redistribution layer 712 in contact with the dielectric layer 711. The redistribution layer 712 may be electrically connected to the electrode via 30, the first inner vias 40 and the outer vias 50. In some embodiments, the redistribution layer 712 may include a plurality of bonding pads 713 disposed on the dielectric layer 711.

In some embodiments, the second redistribution structure 72 may include at least one dielectric layer 721 disposed on the second dielectric structure 17 and a redistribution layer 722 in contact with the dielectric layer 721. The redistribution layer 722 may be electrically connected to the second inner vias 60 and the outer vias 50. In some embodiments, the redistribution layer 722 may include a plurality of bonding pads 723 disposed on the dielectric layer 721.

The first protection layer 81 (e.g., a solder resist layer) covers the dielectric layer 711 and the bonding pads 713 of the first redistribution structure 71 and defines a plurality of openings 812 to expose a portion of each of the bonding pads 713. The second protection layer 82 (e.g., a solder resist layer) covers the dielectric layer 721 and the bonding pads 723 of the second redistribution structure 72 and defines a plurality of openings 822 to expose a portion of each of the bonding pads 723.

Figure 3:
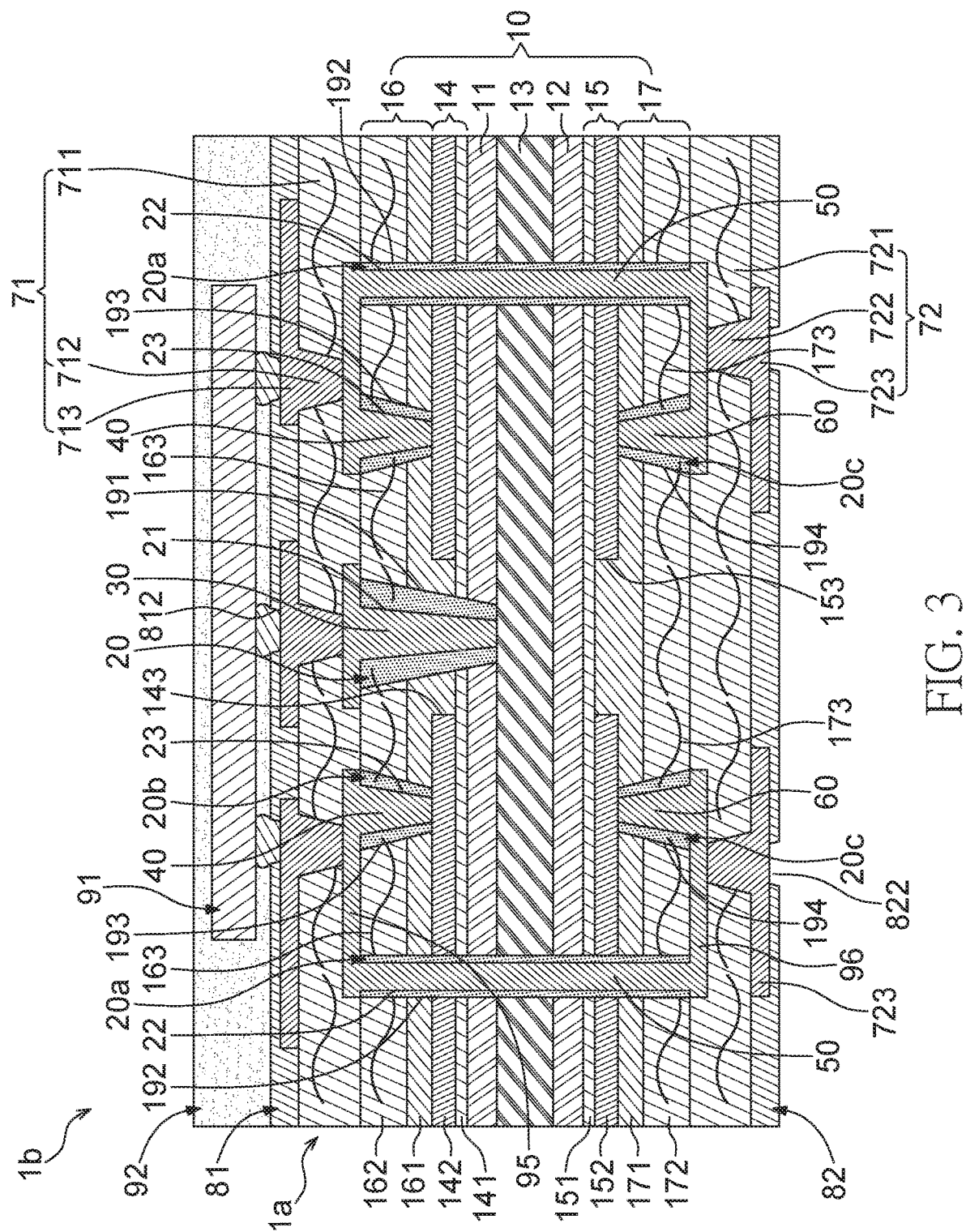
FIG. 3 illustrates a cross-sectional view of a device structure according to some embodiments of the present disclosure.

FIG. 3 illustrates a cross-sectional view of a device structure 1*b* according to some embodiments of the present disclosure. The device structure 1*b* is similar to the device structure 1*a* shown in FIG. 2, except that the device structure 1*b* further includes at least one semiconductor element 91 and an encapsulant 92. In some embodiments, the device structure 1*b* may be a package structure. The semiconductor element 91 may be, for example, a semiconductor die or a semiconductor chip. The semiconductor element 91 is electrically connected to the redistribution layer 712 of the first redistribution structure 71. For example, the semiconductor element 91 may be bonded to the bonding pads 713 of the redistribution layer 712 by flip chip bonding. In addition, the encapsulant 92 is disposed on the first protection layer 81 to cover the semiconductor element 91. A material of the encapsulant 92 may be a molding compound with or without fillers.

Figure 4:
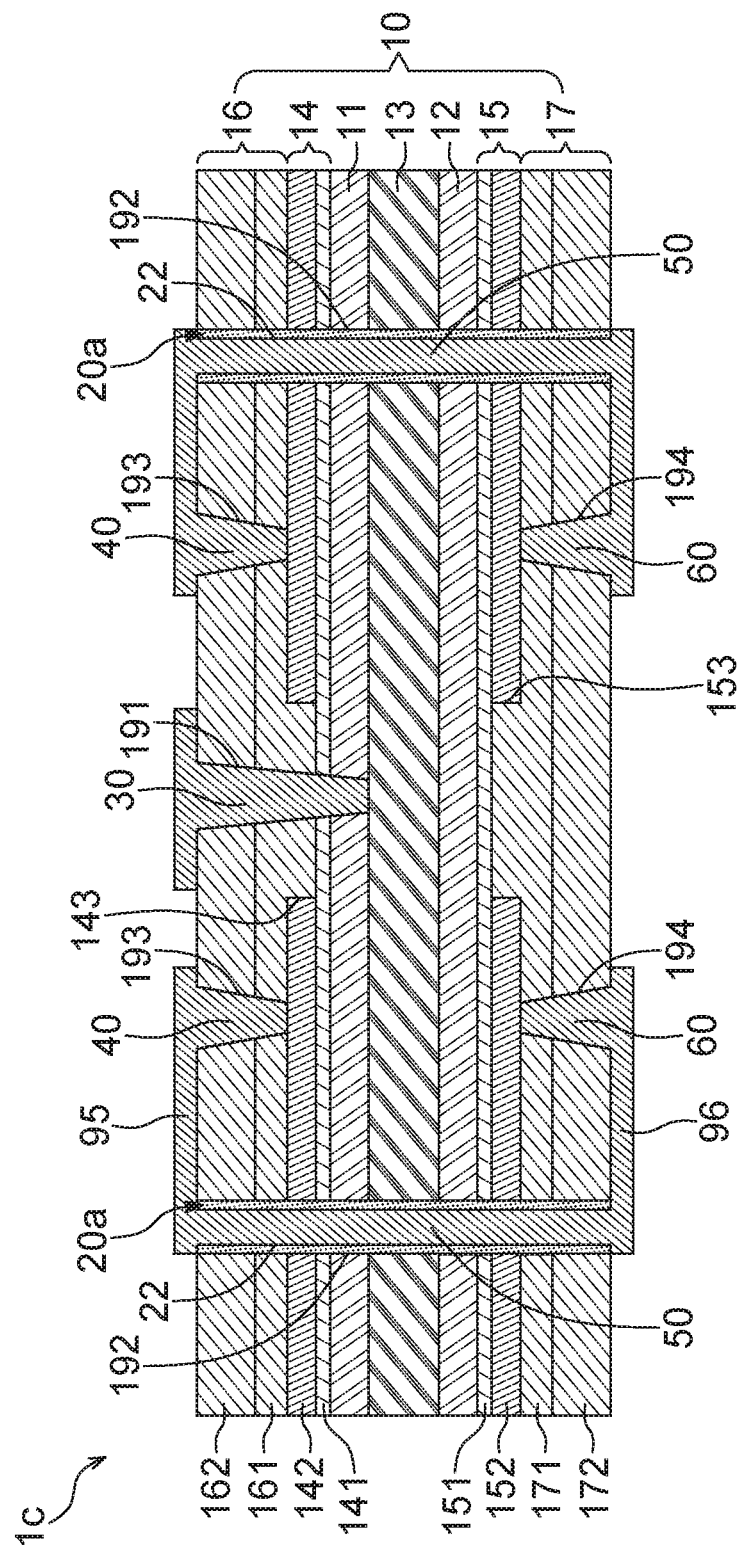
FIG. 4 illustrates a cross-sectional view of a device structure according to some embodiments of the present disclosure.

FIG. 4 illustrates a cross-sectional view of a device structure 1*c* according to some embodiments of the present disclosure. The device structure 1*c* is similar to the device structure 1 shown in FIG. 1, except that the dielectric material 20, the dielectric material 20*b* and the dielectric material 20*c* are omitted. Thus, the electrode via 30 fills the central through hole 191, the outer vias 50 fill the outer through holes 192, the first inner vias 40 fill the first inner through holes 193, and the second inner vias 60 fill the second inner through holes 194. In addition, a material of the second dielectric layer 162 may be the same as a material of the first dielectric layer 161, thus, there may be no boundary between the first dielectric layer 161 and the second dielectric layer 162. Further, a material of the second dielectric layer 172 may be the same as a material of the first dielectric layer 171, thus, there may be no boundary between the first dielectric layer 171 and the second dielectric layer 172. In some embodiments, the materials of the second dielectric layer 162 and the first dielectric layer 161 may be ajinomoto build-up film (ABF), and the materials of the second dielectric layer 172 and the first dielectric layer 171 may also be ajinomoto build-up film (ABF).

Figure 5:
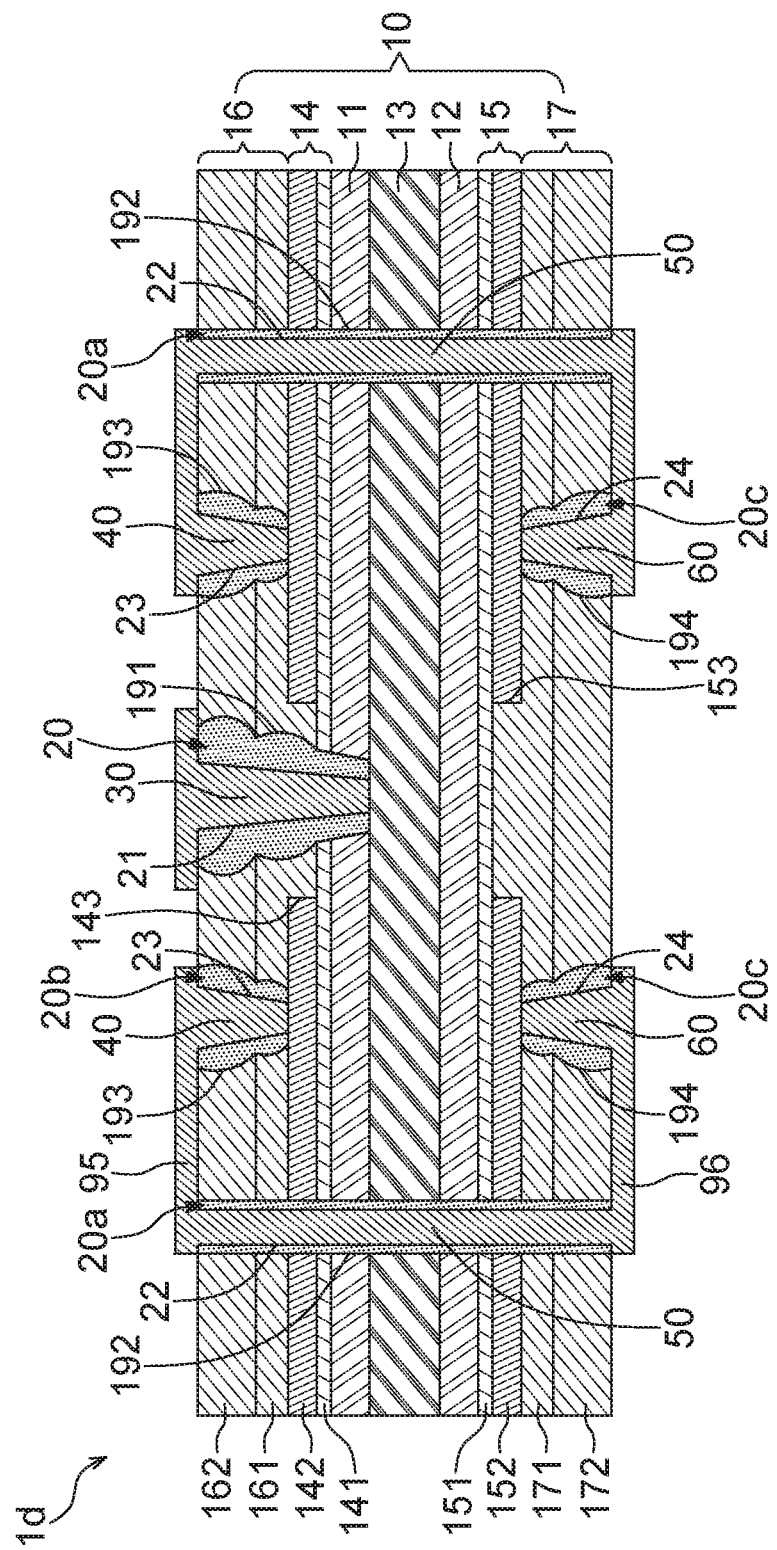
FIG. 5 illustrates a cross-sectional view of a device structure according to some embodiments of the present disclosure.

FIG. 5 illustrates a cross-sectional view of a device structure 1*d* according to some embodiments of the present disclosure. The device structure 1*d* is similar to the device structure 1 shown in FIG. 1, except that the shapes of the dielectric material 20, the dielectric material 20*b* and the dielectric material 20*c*. In some embodiments, the dielectric material 20, the dielectric material 20*b* and the dielectric material 20*c* may be in shape of gourd. In some embodiments, the materials of the second dielectric layer 162 and the first dielectric layer 161 may be ajinomoto build-up film (ABF), and the materials of the second dielectric layer 172 and the first dielectric layer 171 may also be ajinomoto build-up film (ABF).

Figure 6:
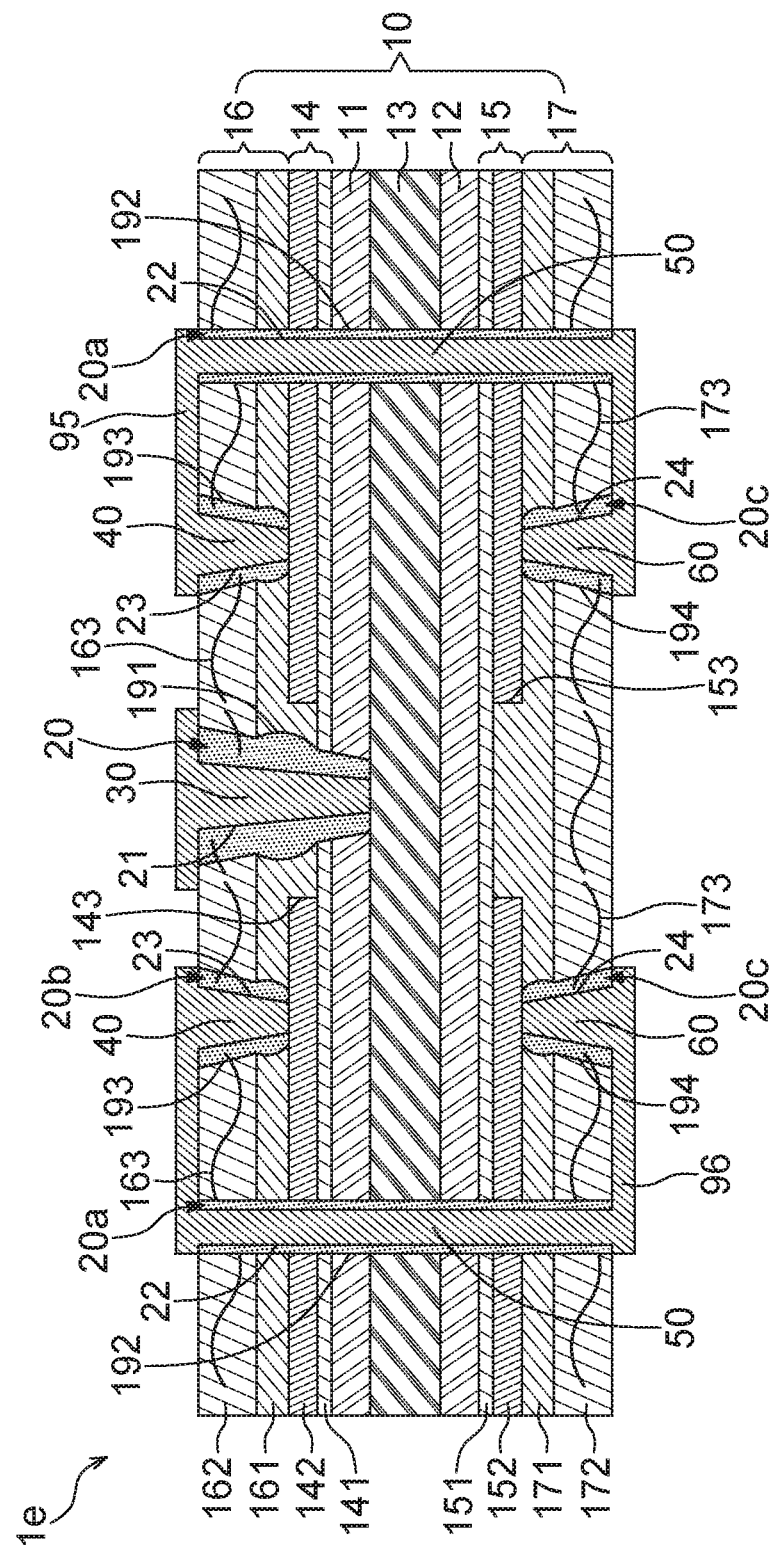
FIG. 6 illustrates a cross-sectional view of a device structure according to some embodiments of the present disclosure.

FIG. 6 illustrates a cross-sectional view of a device structure 1e according to some embodiments of the present disclosure. The device structure 1e is similar to the device structure 1 shown in FIG. 1, except that the shapes of the dielectric material 20, the dielectric material 20b and the dielectric material 20c. In some embodiments, a middle portion of the dielectric material 20 may be in shape of convex, a lower portion of the dielectric material 20b may be in shape of convex, and an upper portion of the dielectric material 20c may be in shape of convex. In some embodiments, the materials of the first dielectric layer 161 and the first dielectric layer 171 may be ajinomoto build-up film (ABF), and the materials of the second dielectric layer 162 and the second dielectric layer 172 may be polypropylene (PP).

FIG. 7 through FIG. 12 illustrate a method for manufacturing a device structure according to some embodiments of the present disclosure. In some embodiments, the method is for manufacturing a device structure such as the device structure 1 shown in FIG. 1.

Figure 7:
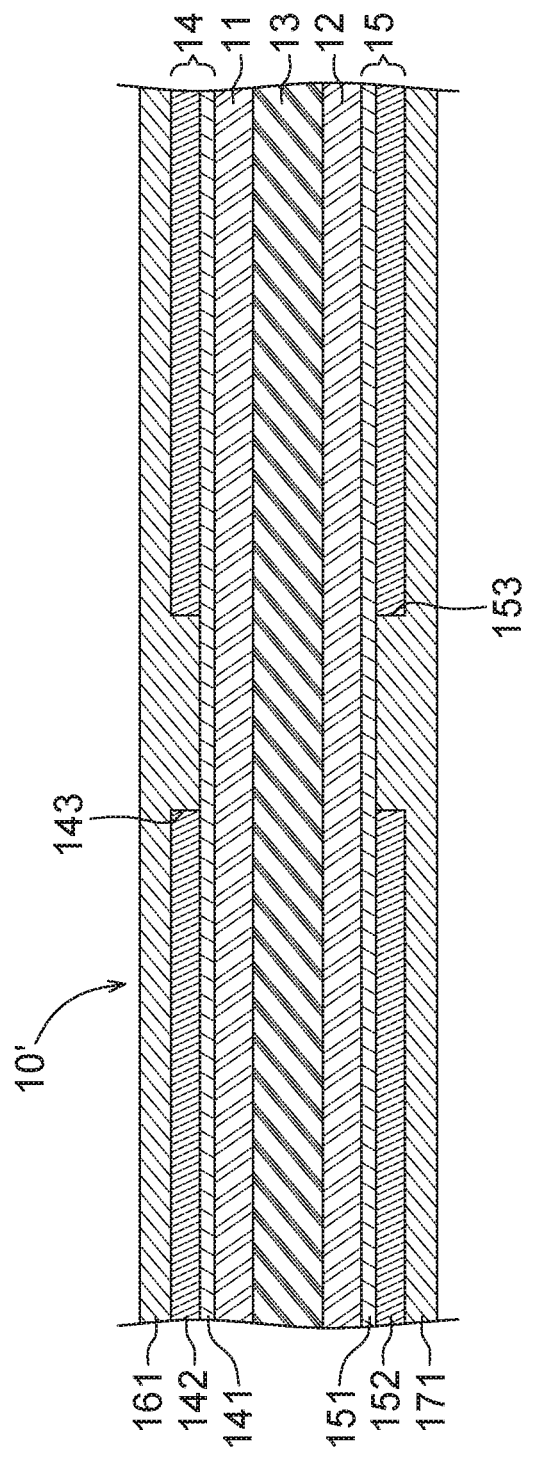
FIG. 7 illustrates one or more stages of an example of a method for manufacturing a device structure according to some embodiments of the present disclosure.
Figure 8:
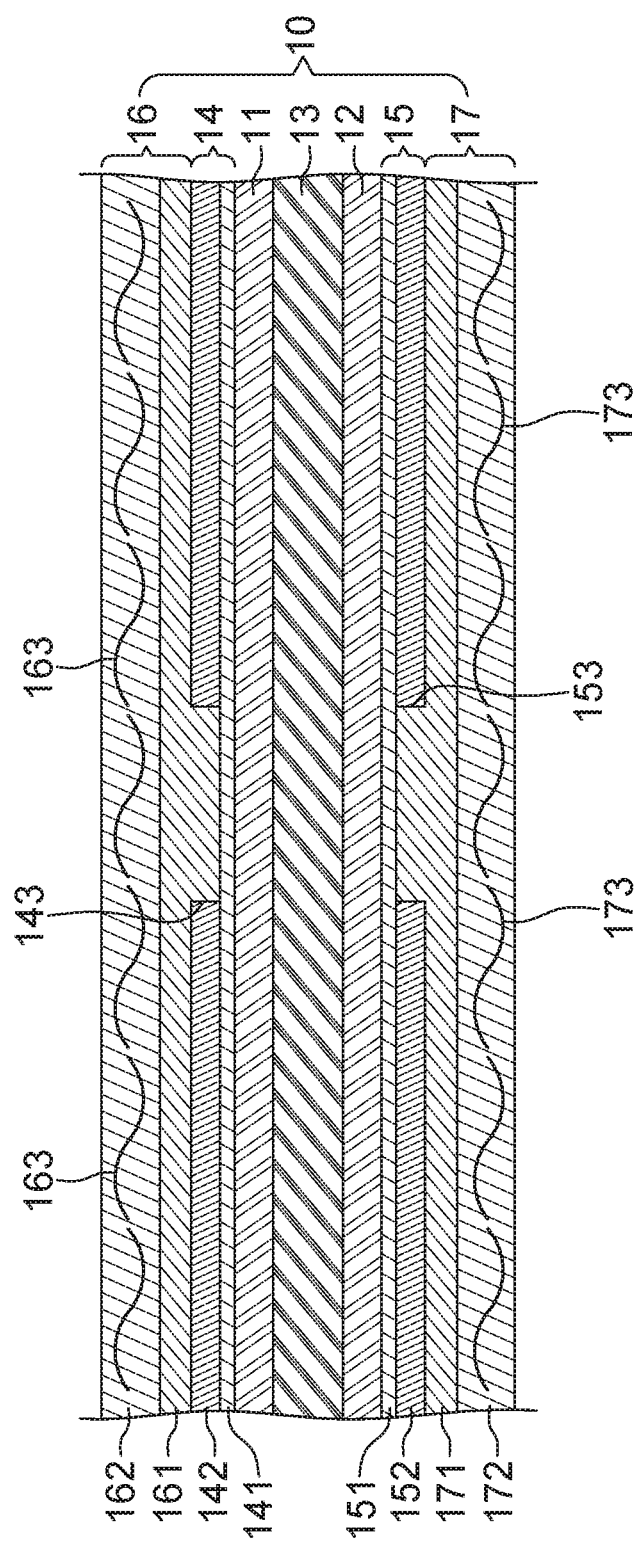
FIG. 8 illustrates one or more stages of an example of a method for manufacturing a device structure according to some embodiments of the present disclosure.

Referring to FIG. 7 through FIG. 8, a stacked structure 10 is provided. Referring to FIG. 7, a sheet material 10' is provided. The sheet material 10' includes a first metal oxide layer 11, a second metal oxide layer 12, a metal layer 13, a first electrode structure 14, a second electrode structure 15, a first dielectric layer 161 and a first dielectric layer 171.

A material of the first metal oxide layer 11 may be, for example, aluminum oxide ($Al_2O_3$). The second metal oxide layer 12 is opposite to the first metal oxide layer 11. A material of the second metal oxide layer 12 may be, for example, aluminum oxide ($Al_2O_3$). The metal layer 13 is interposed between the first metal oxide layer 11 and the second metal oxide layer 12. A material of the metal layer 13 may be, for example, aluminum (Al).

The first electrode structure 14 is disposed adjacent to the first metal oxide layer 11. In some embodiments, the first electrode structure 14 may include an insulating layer 141 formed on the first metal oxide layer 11 and an electrode layer 142 formed on the insulating layer 141. A material of the insulating layer 141 may be, for example, polymer. A material of the electrode layer 142 may be, for example, copper. The electrode layer 142 may define an opening 143 extending through the electrode layer 142.

The second electrode structure 15 is disposed adjacent to the second metal oxide layer 12. In some embodiments, the second electrode structure 15 may include an insulating layer 151 formed on the second metal oxide layer 12 and an electrode layer 152 formed on the insulating layer 151. A material of the insulating layer 151 may be, for example, polymer. A material of the electrode layer 152 may be, for example, copper. The electrode layer 152 may define an opening 153 extending through the electrode layer 152.

The first dielectric layer 161 covers the first electrode structure 14. A material of the first dielectric layer 161 may be, for example, ajinomoto build-up film (ABF). The first dielectric layer 171 covers the second electrode structure 15. A material of the first dielectric layer 171 may be, for example, ajinomoto build-up film (ABF).

Referring to FIG. 8, a second dielectric layer 162 is formed on the first dielectric layer 161 to form a first dielectric structure 16 and a second dielectric layer 172 is formed on the first dielectric layer 171 to form a second dielectric structure 17. In some embodiments, a material of the second dielectric layer 162 may be different from a material of the first dielectric layer 161. The material of the second dielectric layer 162 may be, for example, polypropylene (PP). In some embodiments, a plurality of fibers 163 may be embedded or dispersed in the second dielectric layer 162 to improve the material strength of the second dielectric layer 162 after curing. In some embodiments, a material of the second dielectric layer 172 may be different from a material of the first dielectric layer 171. The material of the second dielectric layer 172 may be, for example, polypropylene (PP). In some embodiments, a plurality of fibers 173 may be embedded or dispersed in the second dielectric layer 172 to improve the material strength of the second dielectric layer 172 after curing.

Thus, the first metal oxide layer 11, the second metal oxide layer 12, the metal layer 13, the first electrode structure 14, the second electrode structure 15, the first dielectric structure 16 and the second dielectric structure 17 may constitute the stacked structure 10.

Figure 9:
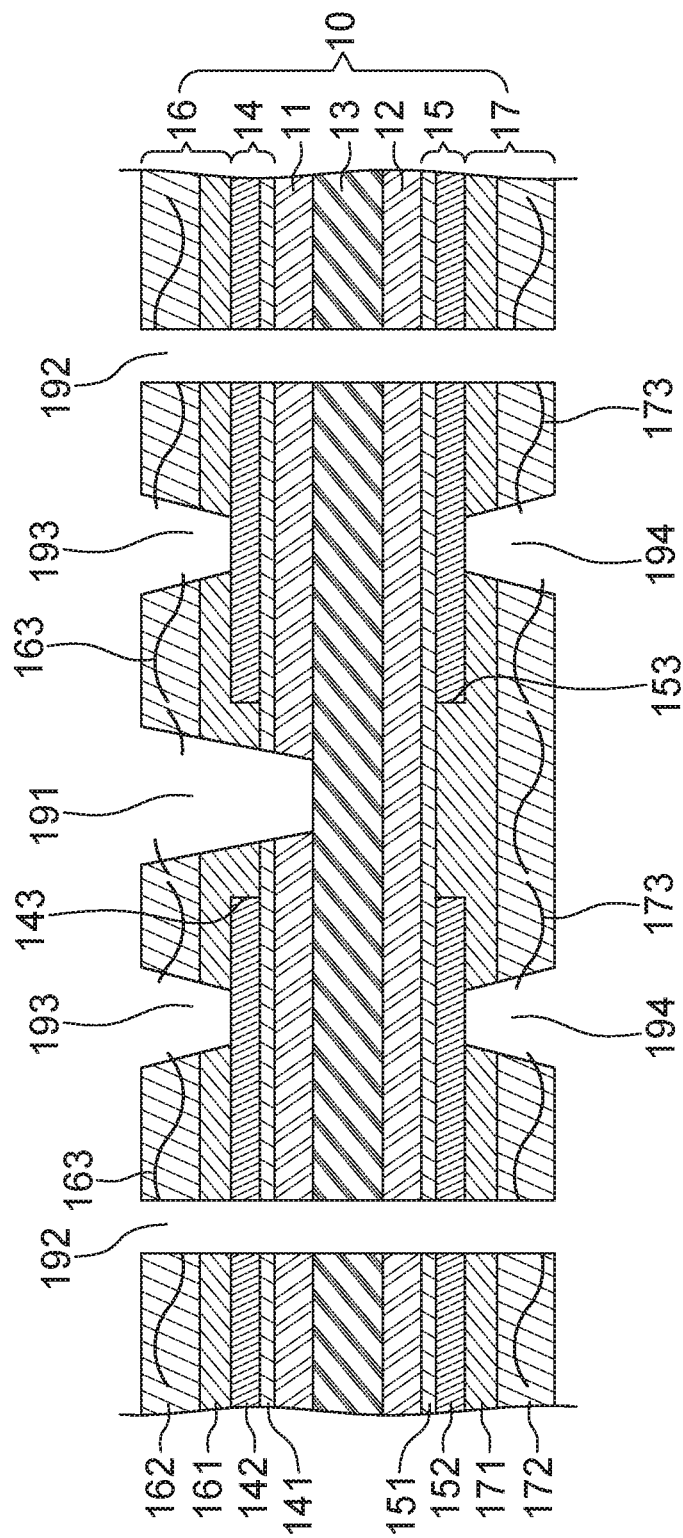
FIG. 9 illustrates one or more stages of an example of a method for manufacturing a device structure according to some embodiments of the present disclosure.

Referring to FIG. 9, at least one central through hole 191 is formed to extend through the first dielectric structure 16, the first electrode structure 14 and the first metal oxide layer 11 to expose a portion of the metal layer 13 by, for example, laser drilling; a plurality of outer through holes 192 are formed to extend through the stacked structure 10 by, for example, mechanical drilling; a plurality of first inner through holes 193 are formed to extend through the first dielectric structure 16 to expose a portion (e.g., a portion of the electrode layer 142) of the first electrode structure 14 by, for example, laser drilling; and a plurality of second inner through holes 194 are formed to extend through the second dielectric structure 17 to expose a portion (e.g., a portion of the electrode layer 152) of the second electrode structure 15 by, for example, laser drilling. In some embodiments, the central through hole 191 should extend through the first metal oxide layer 11; thus, the energy of the laser will be relatively high. As a result, the size of the central through hole 191 will be relatively large. In addition, the laser may not remove the portions of the fibers 163 in the central through hole 191, the first inner through holes 193 and the second inner through holes 194. Thus, the portions (or ends) of the fibers 163 will remain in the central through hole 191, the first inner through holes 193 and the second inner through holes 194, and will adversely affect the subsequent metal plating process.

Figure 10:
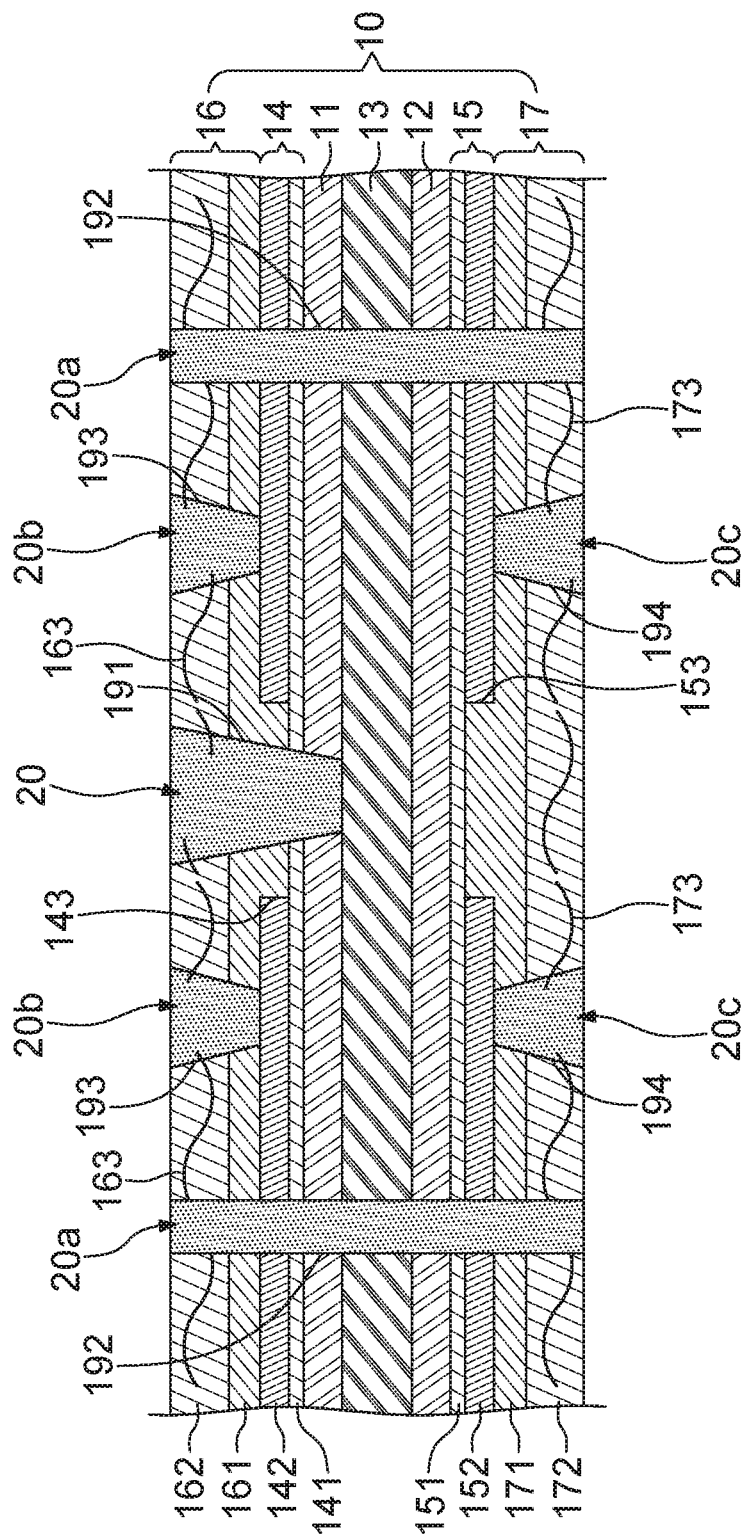
FIG. 10 illustrates one or more stages of an example of a method for manufacturing a device structure according to some embodiments of the present disclosure.

Referring to FIG. 10, a dielectric material (including the dielectric material 20, the dielectric material 20a, the dielectric material 20b, and the dielectric material 20c) may be formed in the central through hole 191, the outer through holes 192, the first inner through holes 193, and the second inner through holes 194 concurrently. As shown in FIG. 10, the dielectric material 20 is disposed in the central through hole 191 and on the exposed portion of the metal layer 13. The dielectric material 20a is disposed in the outer through holes 192. The dielectric material 20b is disposed in the first inner through holes 193 and on the exposed portion (e.g., the exposed portion of the electrode layer 142) of the first electrode structure 14. The dielectric material 20c is disposed in the second inner through holes 194 and on the exposed portion (e.g., the exposed portion of the electrode layer 152) of the second electrode structure 15.

Figure 11:
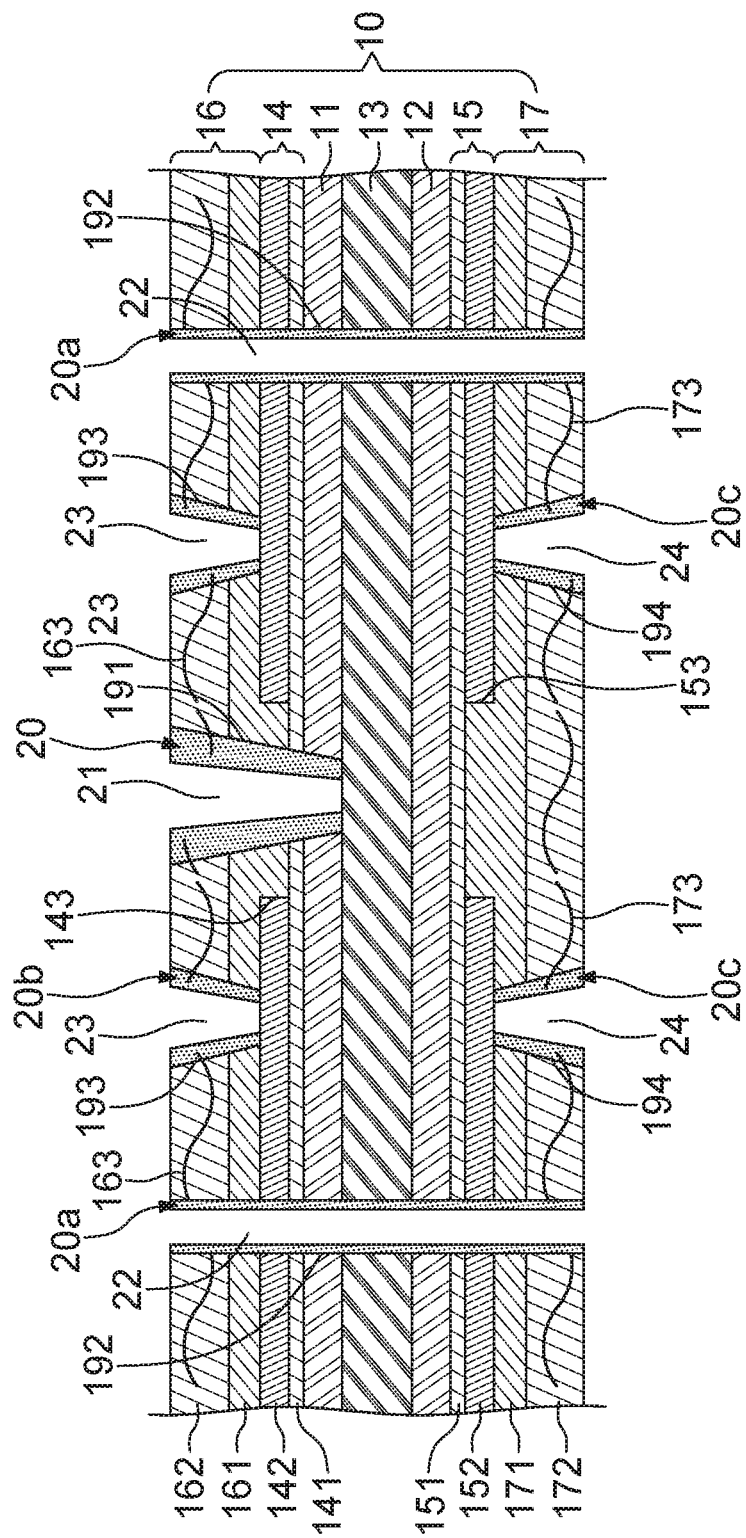
FIG. 11 illustrates one or more stages of an example of a method for manufacturing a device structure according to some embodiments of the present disclosure.

Referring to FIG. 11, a central opening 21 is formed to extend through the dielectric material 20 in the central through hole 191 to expose a portion of the exposed portion of the metal layer 13 by, for example, laser drilling; an outer opening 22 is formed to extend through the dielectric material 20a in each of the outer through holes 192 by, for example, mechanical drilling or laser drilling; a first inner opening 23 is formed to extend through the dielectric material 20b in each of the first inner through holes 193 to expose a portion of the exposed portion (e.g., the exposed portion of the electrode layer 142) of the first electrode structure 14 by, for example, laser drilling; and a second inner opening 24 is formed to extend through the dielectric material 20c in each of the second inner through holes 194 to expose a portion of the exposed portion (e.g., the exposed portion of the electrode layer 152) of the second electrode structure 15 by, for example, laser drilling. In some embodiments, the energy of the laser to form the central opening 21 is less than the energy of the laser to form the central through hole 191 (FIG. 9) since the laser to form the central opening 21 is solely used to remove a portion the soft dielectric material 20. Thus, the size of the central opening 21 is less than the size of central through hole 191, the size of the central opening 21 may be a desired size. For example, a diameter of a top portion (e.g., a maximum portion) of the central through hole 191 may be 40 μm to 50 μm, and a diameter of a top portion (e.g., a maximum portion) of the central opening 21 may be about 10 μm.

Figure 12:
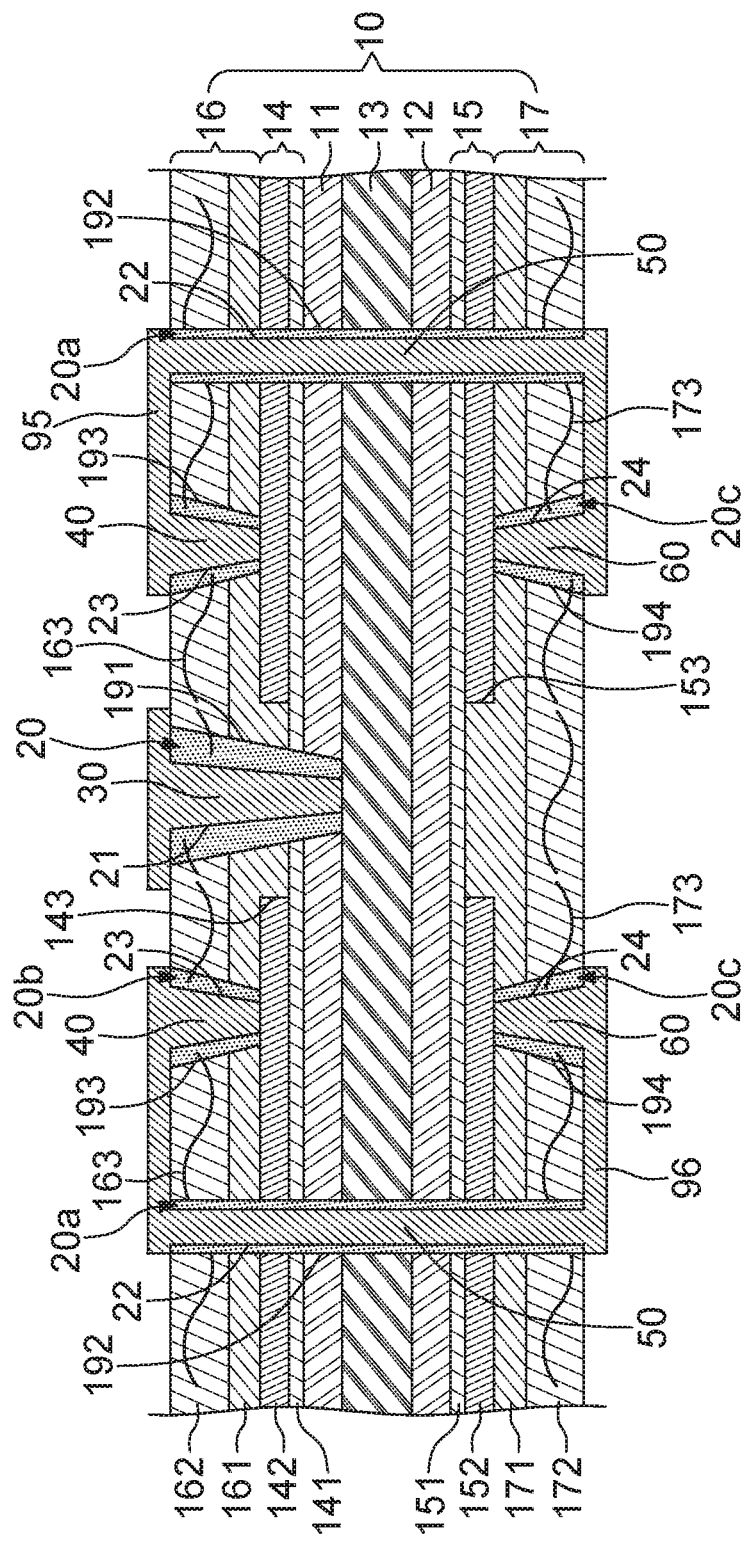
FIG. 12 illustrates one or more stages of an example of a method for manufacturing a device structure according to some embodiments of the present disclosure.

Referring to FIG. 12, an electrode via 30 is formed in the central opening 21 and on the exposed portion of the metal layer 13; a plurality of outer vias 50 are formed in the outer openings 22; a plurality of first inner vias 40 are formed in the first inner openings 23 and on the exposed portion (e.g., the exposed portion of the electrode layer 142) of the first electrode structure 14; and a plurality of second inner vias 60 are formed in the second inner openings 24 and on the exposed portion (e.g., the exposed portion of the electrode layer 152) of the second electrode structure 15. In some embodiments, a circuit layer 95 may be formed on a top surface of the first dielectric structure 16 to electrically connect the first inner vias 40 and the outer vias 50, and a circuit layer 96 may be formed on a bottom surface of the second dielectric structure 17 to electrically connect the second inner vias 60 and the outer vias 50. In some embodiments, the electrode via 30, the outer vias 50, the first inner vias 40, the second inner vias 60, the circuit layer 95 and the circuit layer 96 may be formed concurrently.

Then, a singulation process is conducted to obtain a plurality of device structures 1 of FIG. 1.

Figure 13:
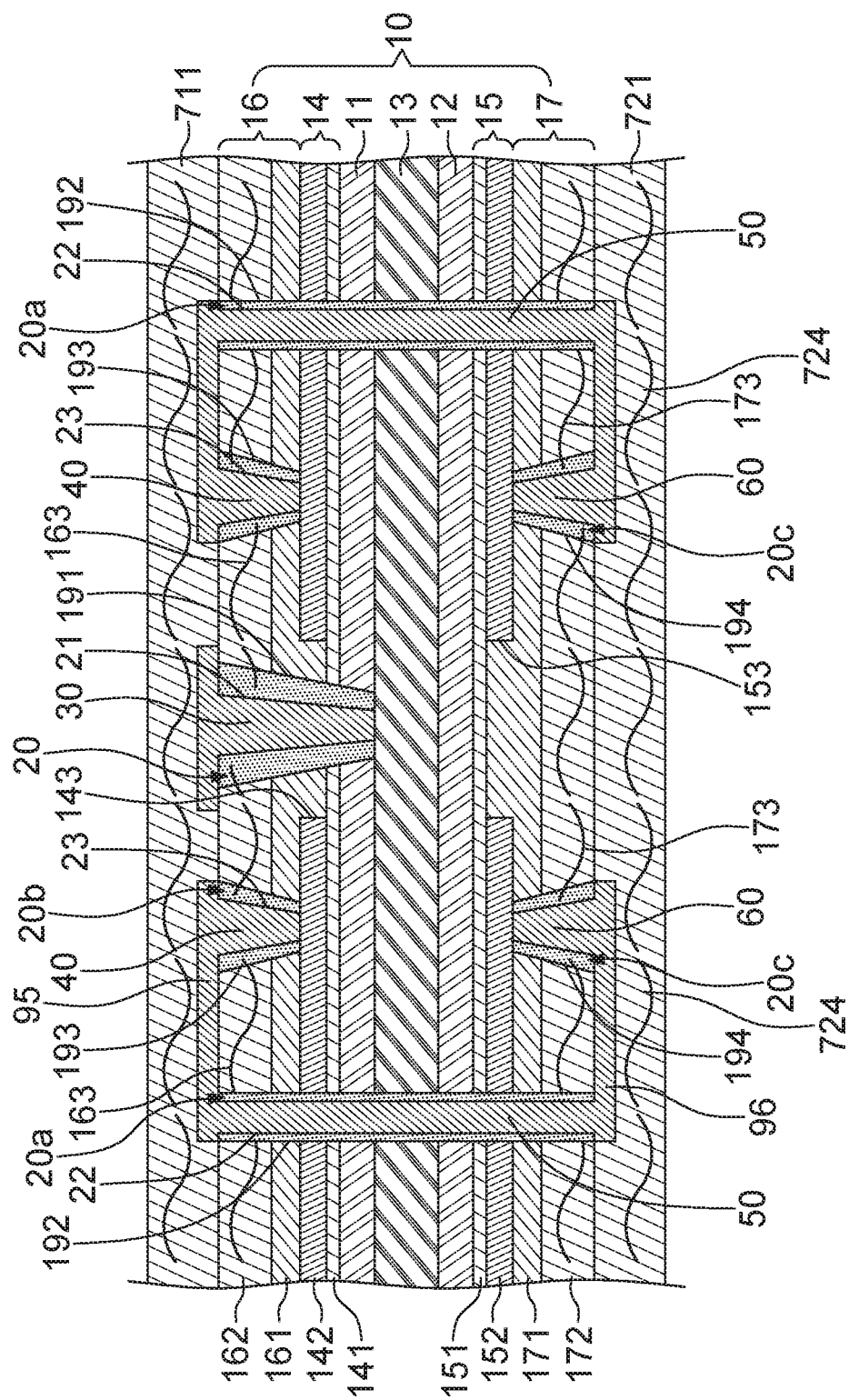
FIG. 13 illustrates one or more stages of an example of a method for manufacturing a device structure according to some embodiments of the present disclosure.

FIG. 13 through FIG. 16 illustrate a method for manufacturing a device structure according to some embodiments of the present disclosure. In some embodiments, the method is for manufacturing a device structure such as the device structure 1a shown in FIG. 2. The initial several stages of the illustrated process are the same as, or similar to, the stages illustrated in FIG. 7 through FIG. 12. FIG. 13 depicts a stage subsequent to that depicted in FIG. 12.

Figure 14:
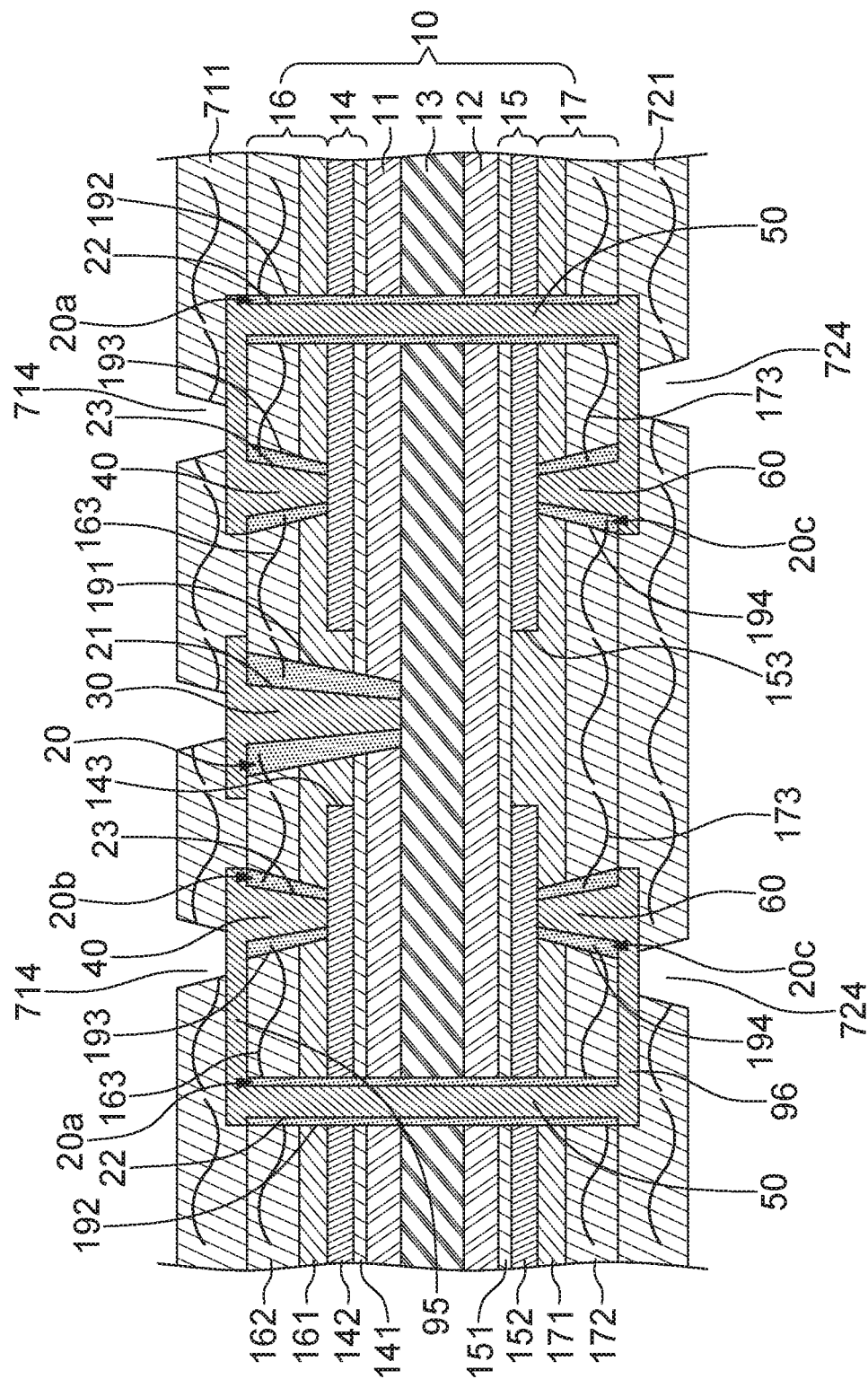
FIG. 14 illustrates one or more stages of an example of a method for manufacturing a device structure according to some embodiments of the present disclosure.
Figure 15:
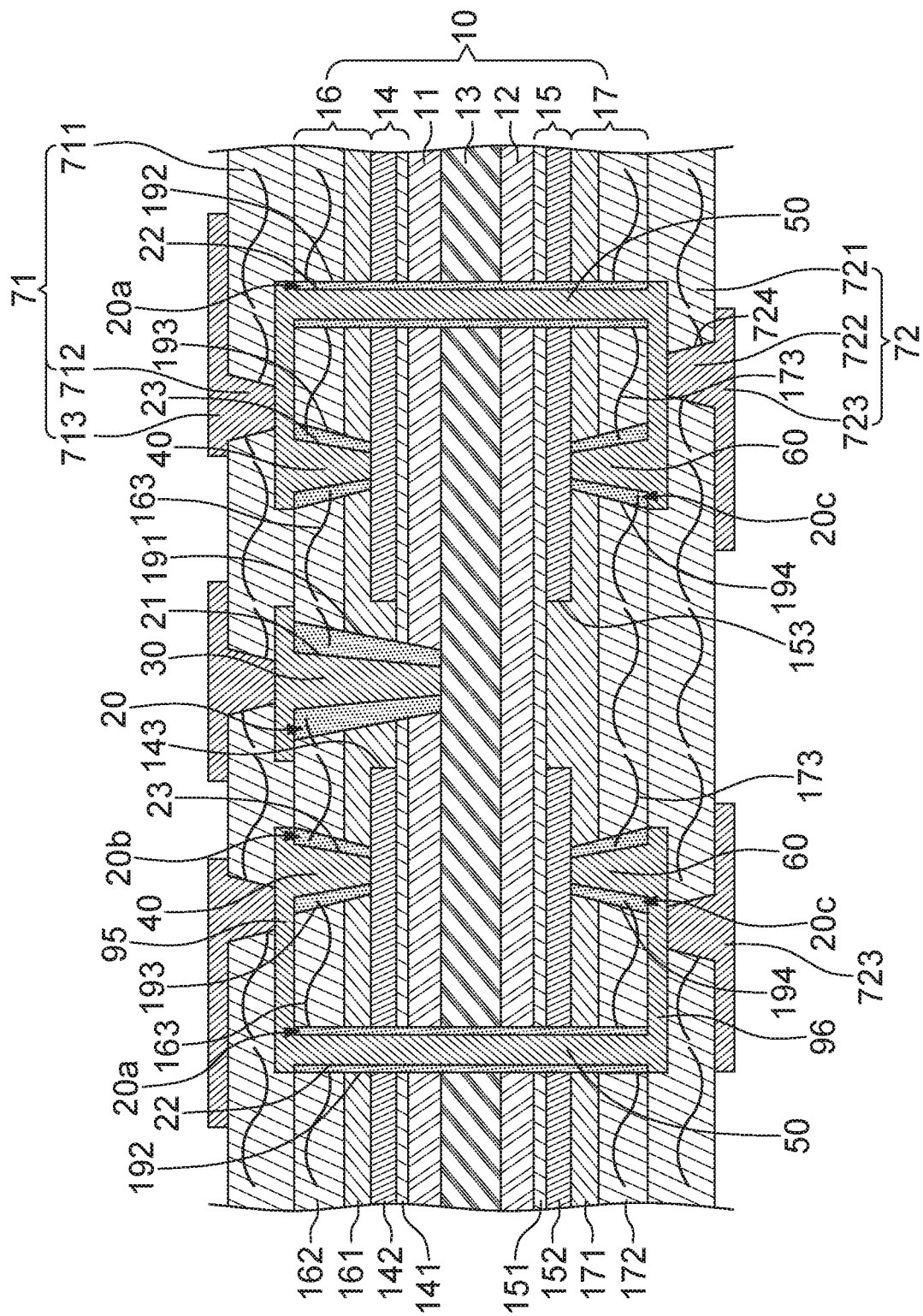
FIG. 15 illustrates one or more stages of an example of a method for manufacturing a device structure according to some embodiments of the present disclosure.

Referring to FIG. 13 through FIG. 15, a first redistribution structure 71 is formed on the first dielectric structure 16 and a second redistribution structure 72 is formed on the second dielectric structure 17.

Referring to FIG. 13, at least one dielectric layer 711 is formed on the first dielectric structure 16 (e.g., the top surface of the first dielectric structure 16) and at least one dielectric layer 721 is formed on the second dielectric structure 17 (e.g., the bottom surface of the second dielectric structure 17).

Referring to FIG. 14, a plurality of openings 714 are formed to extend through the dielectric layer 711 to expose a portion of the circuit layer 95, and a plurality of openings 724 are formed to extend through the dielectric layer 721 to expose a portion of the circuit layer 96.

Referring to FIG. 15, a redistribution layer 712 is formed in the openings 714 and on the dielectric layer 711, and a redistribution layer 722 is formed in the openings 724 on the dielectric layer 721. Thus, the dielectric layer 711 and the redistribution layer 712 may constitute the first redistribution structure 71, and the dielectric layer 721 and the redistribution layer 722 may constitute the second redistribution structure 72. In some embodiments, the redistribution layer 712 may include a plurality of bonding pads 713 formed on the dielectric layer 711, and the redistribution layer 722 may include a plurality of bonding pads 723 formed on the dielectric layer 721.

Figure 16:
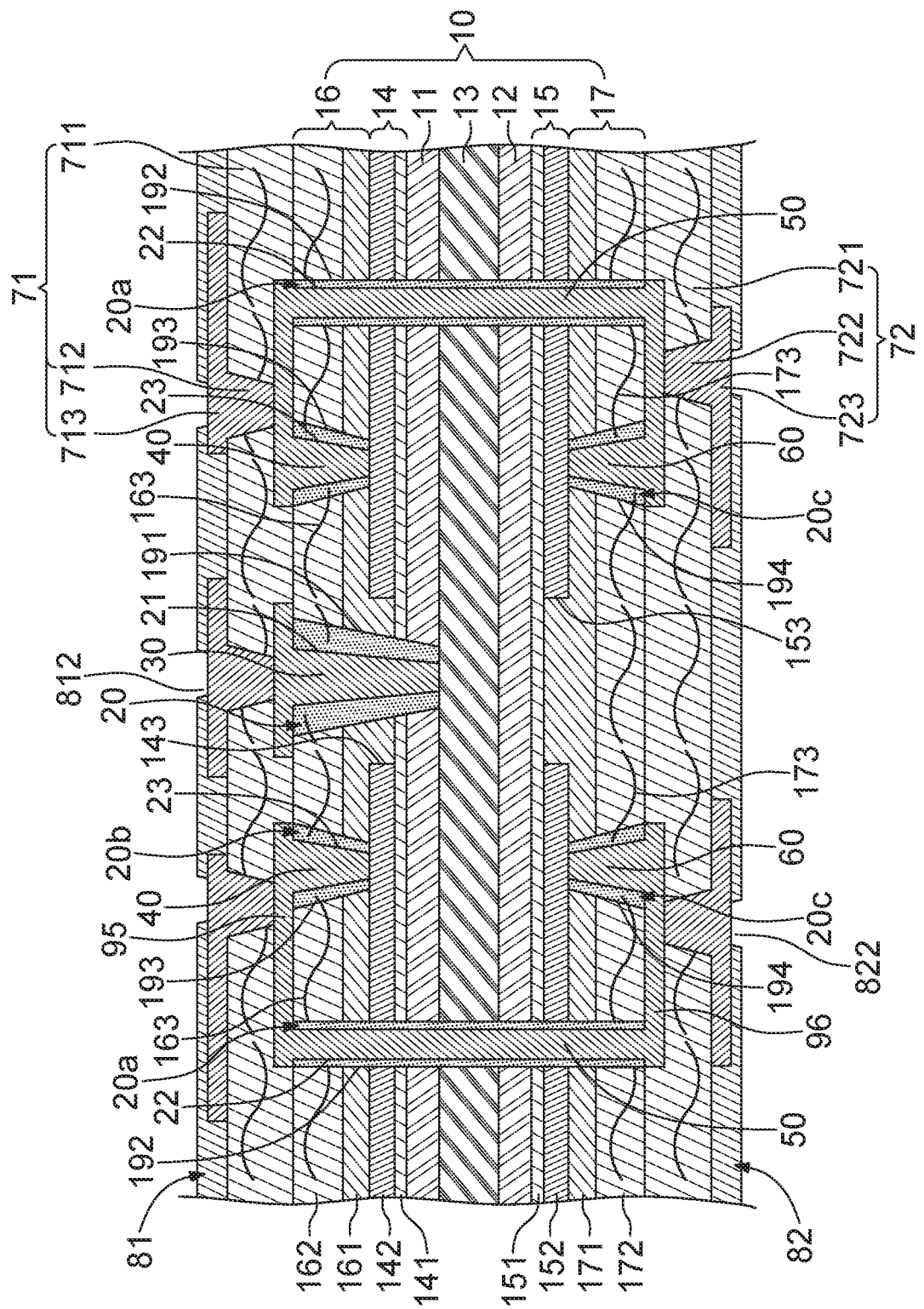
FIG. 16 illustrates one or more stages of an example of a method for manufacturing a device structure according to some embodiments of the present disclosure.

Referring to FIG. 16, a first protection layer 81 is formed on the first redistribution structure 71 to cover the bonding pads 713 and defines a plurality of openings 812 to expose a portion of each of the bonding pads 713; and a second protection layer 82 is formed on the second redistribution structure 72 to cover the bonding pads 723 and defines a plurality of openings 822 to expose a portion of each of the bonding pads 723.

Then, a singulation process is conducted to obtain a plurality of device structures 1a of FIG. 2.

Figure 17:
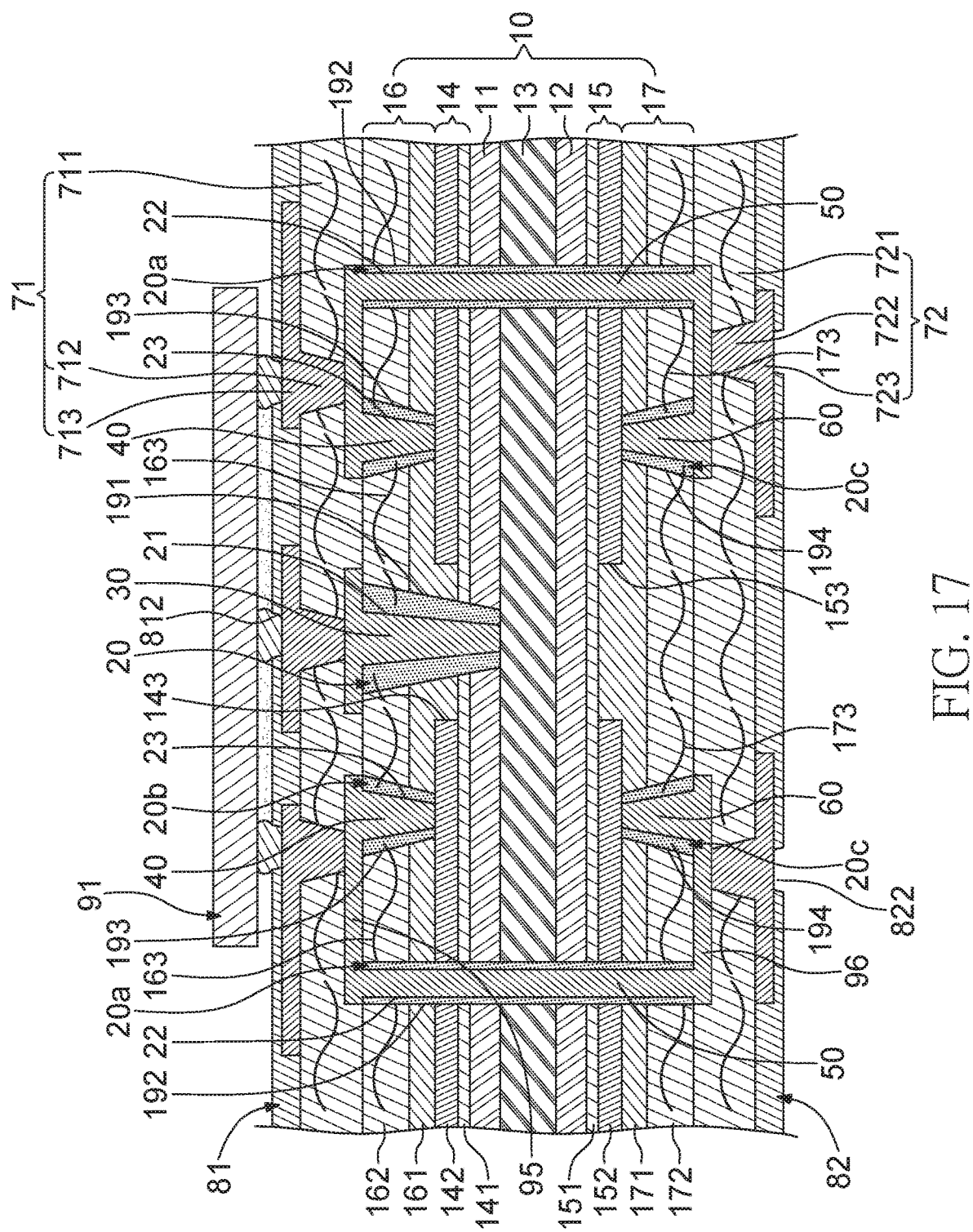
FIG. 17 illustrates one or more stages of an example of a method for manufacturing a device structure according to some embodiments of the present disclosure.
Figure 18:
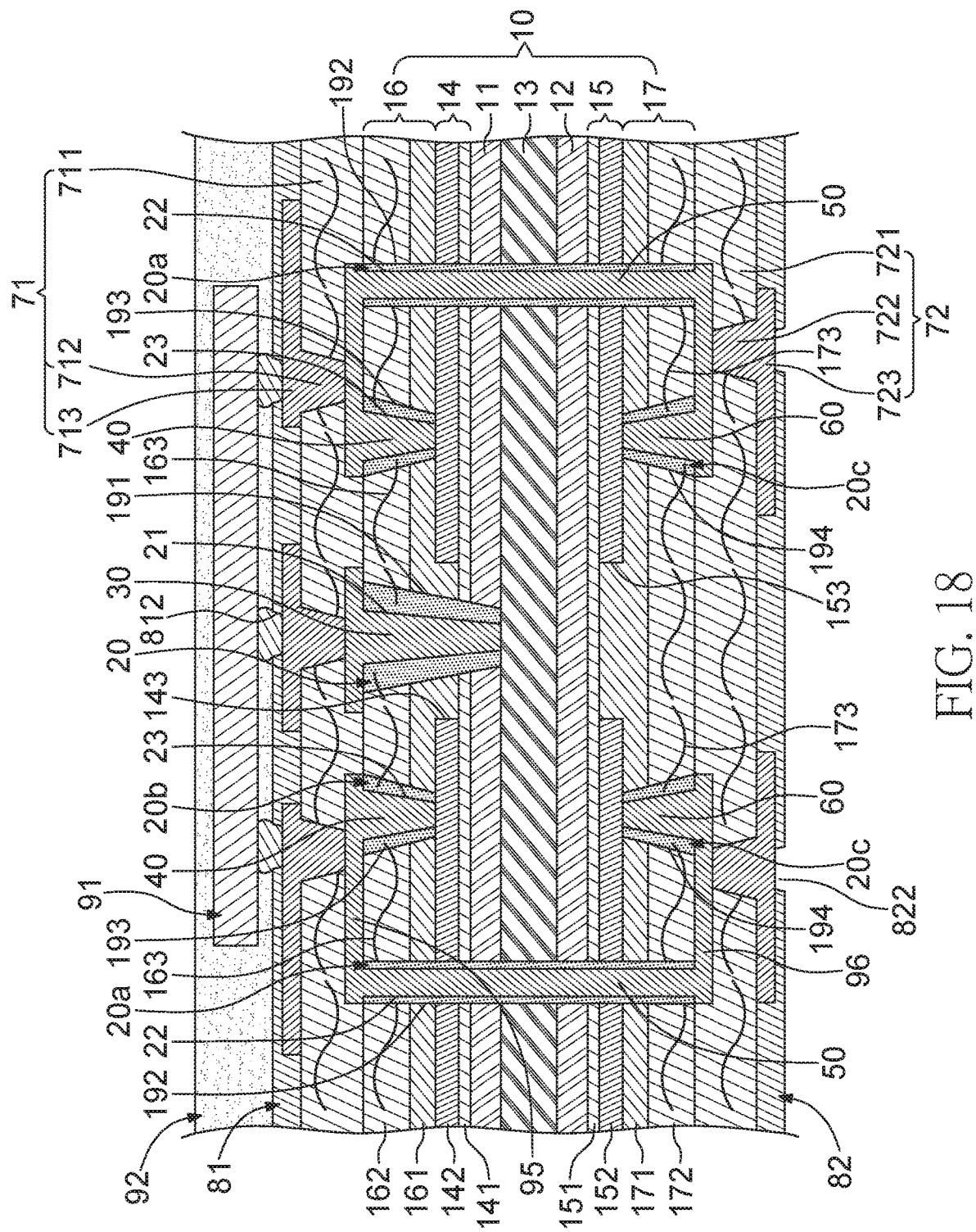
FIG. 18 illustrates one or more stages of an example of a method for manufacturing a device structure according to some embodiments of the present disclosure.

FIG. 17 through FIG. 18 illustrate a method for manufacturing a device structure according to some embodiments of the present disclosure. In some embodiments, the method is for manufacturing a device structure such as the device structure 1b shown in FIG. 3. The initial several stages of the illustrated process are the same as, or similar to, the stages illustrated in FIG. 7 through FIG. 16. FIG. 17 depicts a stage subsequent to that depicted in FIG. 16.

Referring to FIG. 17, at least one semiconductor element 91 is disposed on the first protection layer 81 and electrically connected to the first redistribution structure 71. The semiconductor element 91 may be, for example, a semiconductor die or a semiconductor chip. The semiconductor element 91 is bonded to the bonding pads 713 of the redistribution layer 712 by flip chip bonding.

Referring to FIG. 18, an encapsulant 92 is formed or disposed on the first protection layer 81 to cover the semiconductor element 91. A material of the encapsulant 92 may be a molding compound with or without fillers.

Then, a singulation process is conducted to obtain a plurality of device structures 1b of FIG. 3.

Figure 19:
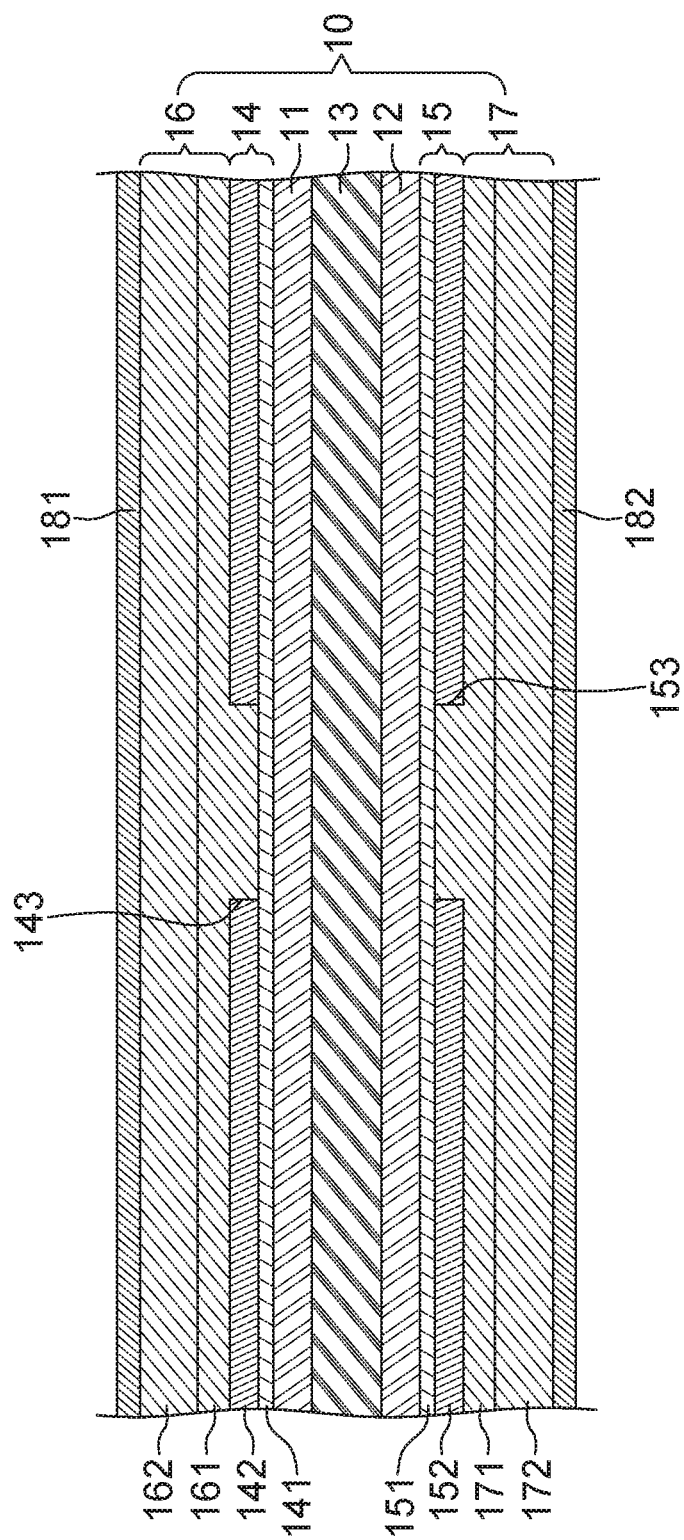
FIG. 19 illustrates one or more stages of an example of a method for manufacturing a device structure according to some embodiments of the present disclosure.

FIG. 19 through FIG. 25 illustrate a method for manufacturing a device structure according to some embodiments of the present disclosure. In some embodiments, the method is for manufacturing a device structure such as the device structure 1c shown in FIG. 4. The initial stage of the illustrated process is the same as, or similar to, the stage illustrated in FIG. 7. FIG. 19 depicts a stage subsequent to that depicted in FIG. 7.

Referring to FIG. 19, a double-layer film including a second dielectric layer 162 and a metal layer 181 formed on the second dielectric layer 162 is attached to the first dielectric layer 161 to form a first dielectric structure 16; and a double-layer film including a second dielectric layer 172 and a metal layer 182 formed on the second dielectric layer 172 is attached to the first dielectric layer 171 to form a second dielectric structure 17. The materials of the metal layer 181 and the metal layer 182 may be, for example, copper. In some embodiments, the materials of the second dielectric layer 162 and the first dielectric layer 161 may be ajinomoto build-up film (ABF) without fibers. The materials of the second dielectric layer 172 and the first dielectric layer 171 may also be ajinomoto build-up film (ABF) without fibers.

Figure 20:
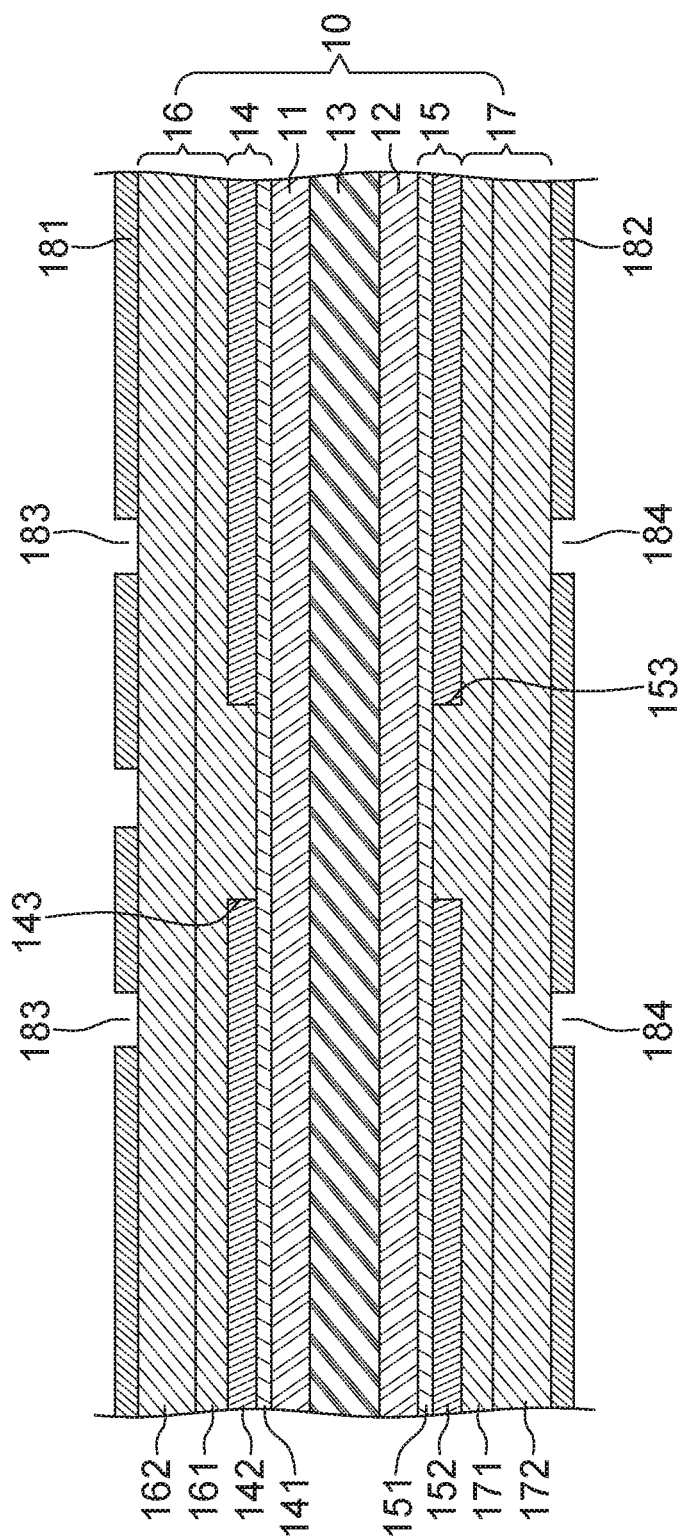
FIG. 20 illustrates one or more stages of an example of a method for manufacturing a device structure according to some embodiments of the present disclosure.

Referring to FIG. 20, a plurality of openings 183 are formed to extend through the metal layer 181 to expose a portion of the second dielectric layer 162, and a plurality of openings 184 are formed to extend through the metal layer 182 to expose a portion of the second dielectric layer 172.

Figure 21:
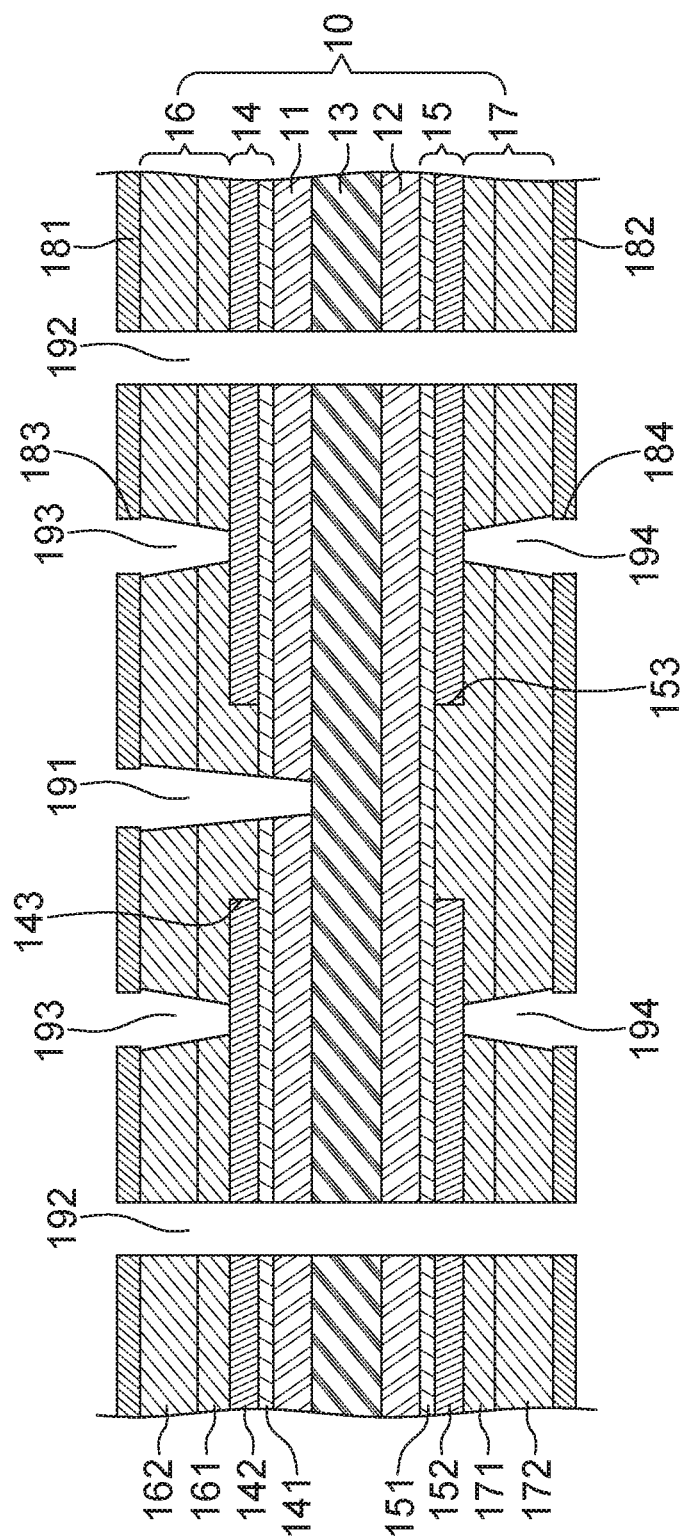
FIG. 21 illustrates one or more stages of an example of a method for manufacturing a device structure according to some embodiments of the present disclosure.

Referring to FIG. 21, at least one central through hole 191 is formed to extend through the first dielectric structure 16, the first electrode structure 14 and the first metal oxide layer 11 to expose a portion of the metal layer 13, and a plurality of first inner through holes 193 are formed to extend through the first dielectric structure 16 to expose a portion (e.g., a portion of the electrode layer 142) of the first electrode structure 14 by, for example, laser drilling through the openings 183 of the metal layer 181. Further, a plurality of second inner through holes 194 are formed to extend through the second dielectric structure 17 to expose a portion (e.g., a portion of the electrode layer 152) of the second electrode structure 15 by, for example, laser drilling through the openings 184 of the metal layer 182. In addition, a plurality of outer through holes 192 are formed to extend through the stacked structure 10 by, for example, mechanical drilling.

Figure 22:
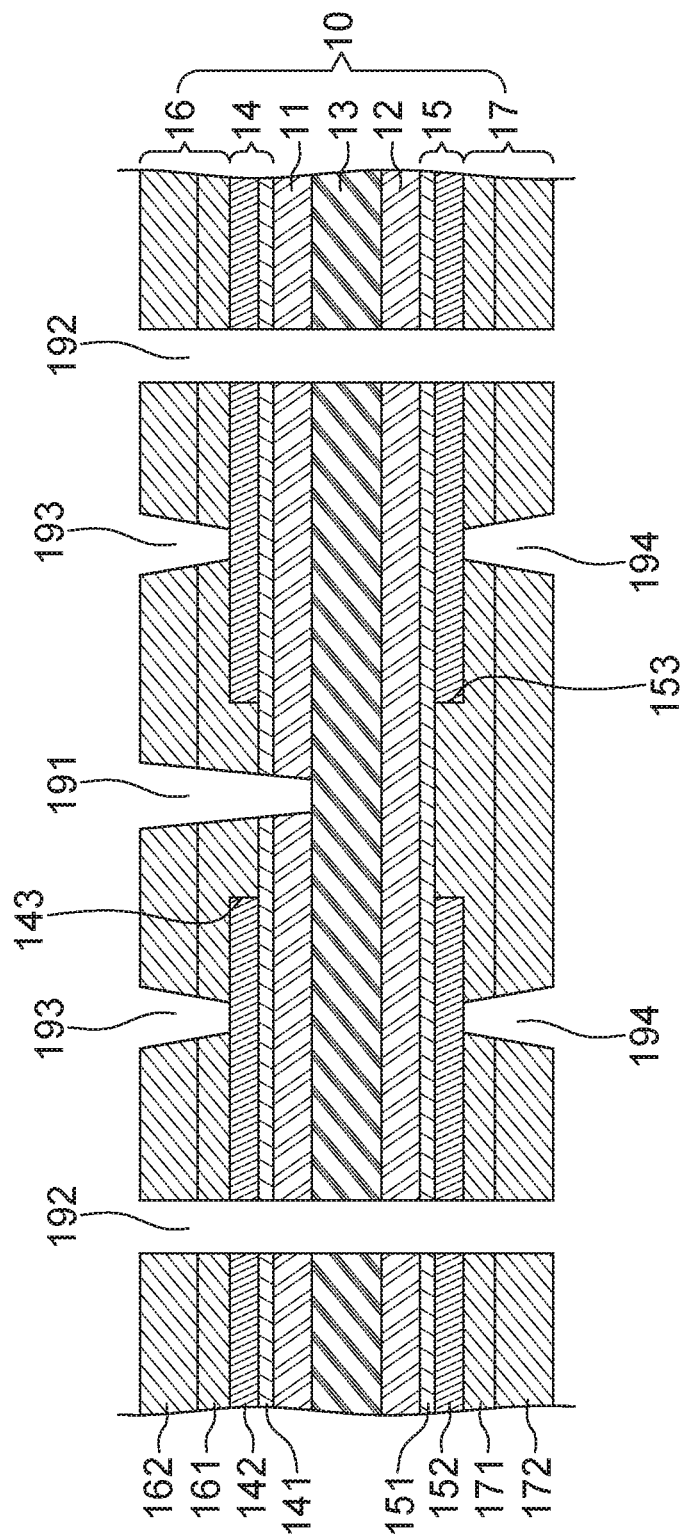
FIG. 22 illustrates one or more stages of an example of a method for manufacturing a device structure according to some embodiments of the present disclosure.

Referring to FIG. 22, the metal layer 181 and the metal layer 182 are removed.

Figure 23:
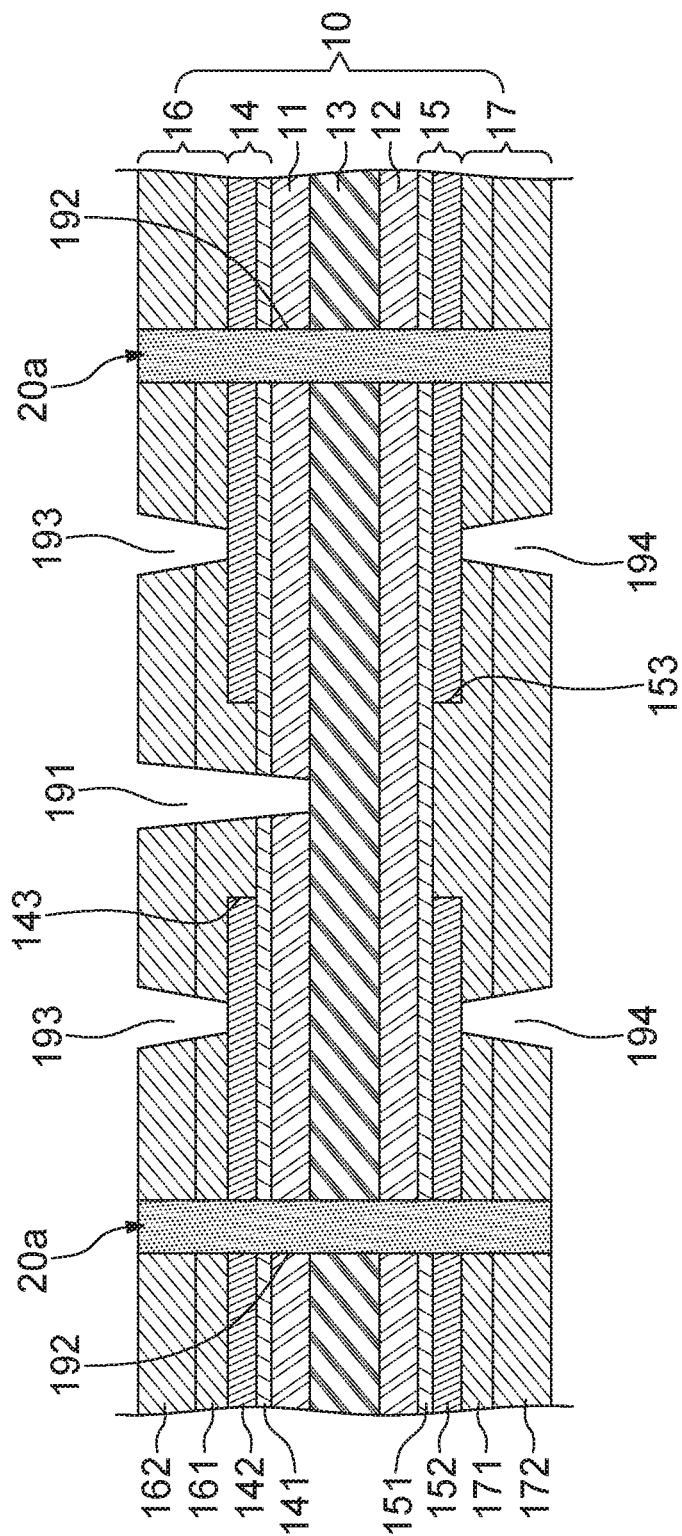
FIG. 23 illustrates one or more stages of an example of a method for manufacturing a device structure according to some embodiments of the present disclosure.

Referring to FIG. 23, a dielectric material 20a is formed in the outer through holes 192.

Figure 24:
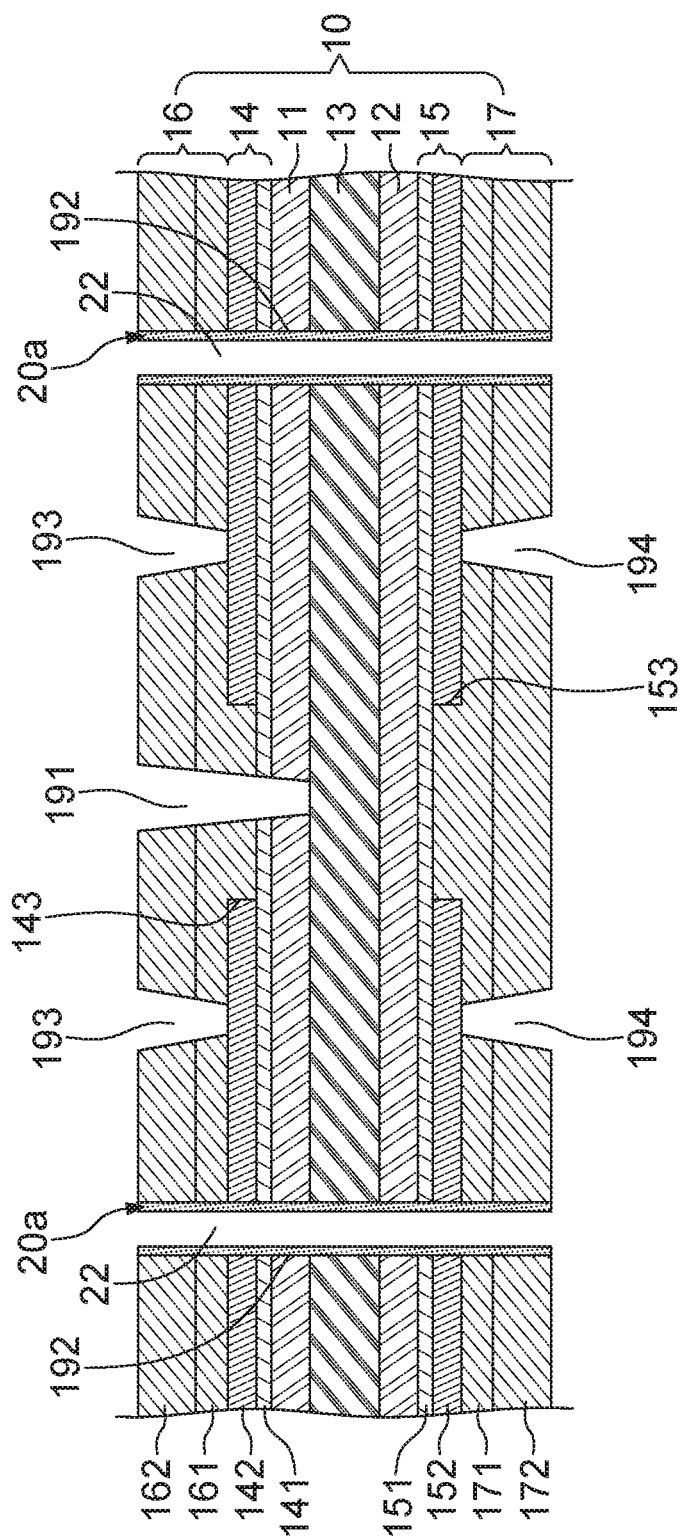
FIG. 24 illustrates one or more stages of an example of a method for manufacturing a device structure according to some embodiments of the present disclosure.

Referring to FIG. 24, an outer opening 22 is formed to extend through the dielectric material 20a in each of the outer through holes 192 by, for example, mechanical drilling or laser drilling.

Figure 25:
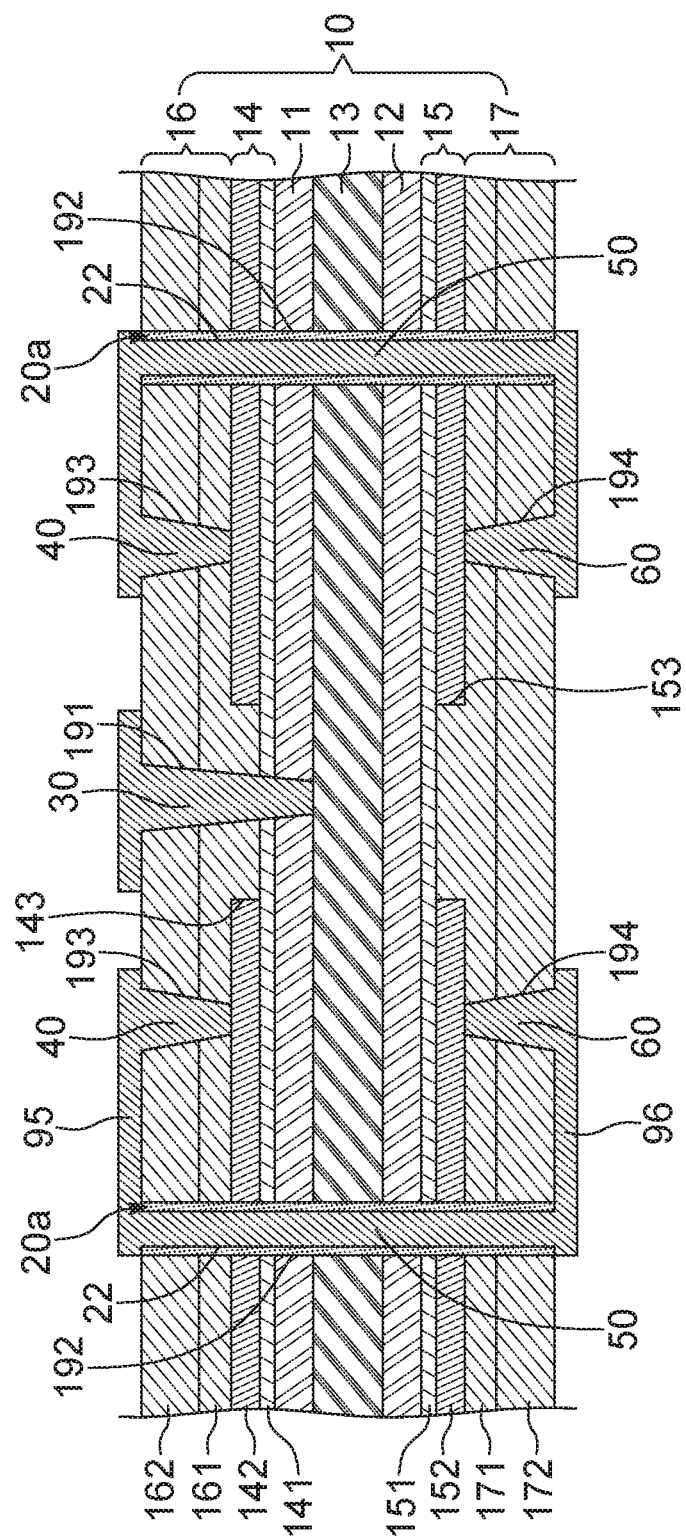
FIG. 25 illustrates one or more stages of an example of a method for manufacturing a device structure according to some embodiments of the present disclosure.

Referring to FIG. 25, an electrode via 30 is formed in the central through hole 191 and on the exposed portion of the metal layer 13; a plurality of outer vias 50 are formed in the outer openings 22; a plurality of first inner vias 40 are formed in the first inner through holes 193 and on the exposed portion (e.g., the exposed portion of the electrode layer 142) of the first electrode structure 14; and a plurality of second inner vias 60 are formed in the second inner through holes 194 and on the exposed portion (e.g., the exposed portion of the electrode layer 152) of the second electrode structure 15. In some embodiments, a circuit layer 95 may be formed on a top surface of the first dielectric structure 16 to electrically connect the first inner vias 40 and the outer vias 50, and a circuit layer 96 may be formed on a bottom surface of the second dielectric structure 17 to electrically connect the second inner vias 60 and the outer vias 50.

Then, a singulation process is conducted to obtain a plurality of device structures 1c of FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A device structure, comprising:
 a stacked structure including:
  a first metal oxide layer;
  a second metal oxide layer opposite to the first metal oxide layer; and
  a metal layer interposed between the first metal oxide layer and the second metal oxide layer;
 a dielectric material extending through the first metal oxide layer; and
 an electrode via extending through the dielectric material and electrically connected to the metal layer;
 wherein the stacked structure further includes a first electrode structure disposed adjacent to the first metal oxide layer and a first dielectric structure covering the first electrode structure, and defines a central through hole extending through the first dielectric structure, the first electrode structure and the first metal oxide layer to expose a portion of the metal layer, the dielectric material is disposed in the central through hole and defines a central opening extending through the dielectric material, and the electrode via is disposed in the central opening.

2. The device structure of claim 1, wherein the dielectric material covers a portion of the metal layer.

3. The device structure of claim 1, wherein the dielectric material tapers downward.

4. The device structure of claim 1, wherein the first electrode structure includes an insulating layer disposed on the first metal oxide layer and an electrode layer disposed on the insulating layer, the electrode layer defines an opening extending through the electrode layer and corresponding to the central through hole, and the first dielectric structure includes a first dielectric layer covering the electrode layer and the opening.

5. The device structure of claim 1, wherein the first dielectric structure includes a first dielectric layer, at least one second dielectric layer disposed on the first dielectric layer and a plurality of fibers embedded in the second dielectric layer, and a portion of the fibers extends into the central through hole.

6. The device structure of claim 5, wherein the dielectric material covers the portion of the fibers extending into the central through hole.

7. The device structure of claim 1, wherein the stacked structure further defines a plurality of outer through holes extending through the stacked structure and a plurality of first inner through holes located between the central through hole and the outer through holes and extending through the first dielectric structure to expose a portion of the first electrode structure.

8. The device structure of claim 1, wherein the device structure is a capacitor.

9. The device structure of claim 1, further comprising a first redistribution structure disposed on and electrically connected to the stacked structure.

10. The device structure of claim 9, wherein the first redistribution structure includes at least one dielectric layer disposed on the first dielectric structure and a redistribution layer in contact with the dielectric layer.

11. The device structure of claim 9, wherein the stacked structure further includes a first electrode structure disposed adjacent to the first metal oxide layer, a first dielectric structure covering the first electrode structure, a second electrode structure disposed adjacent to the second metal oxide layer and a second dielectric structure covering the second electrode structure, and defines a central through hole extending through the first dielectric structure, the first electrode structure and the first metal oxide layer to expose a portion of the metal layer, the dielectric material is disposed in the central through hole and defines a central opening extending through the dielectric material, the electrode via is disposed in the central opening, the device structure further comprises a second redistribution structure disposed on the second dielectric structure, and the second redistribution structure includes at least one dielectric layer disposed on the second dielectric structure and a redistribution layer in contact with the dielectric layer.

12. The device structure of claim 11, wherein the first dielectric structure includes a first dielectric layer, at least one second dielectric layer disposed on the first dielectric layer and a plurality of fibers embedded in the second dielectric layer, and a portion of the fibers extends into the central through hole.

13. The device structure of claim 10, further comprising a first protection layer covering the dielectric layer of the first redistribution structure, at least one semiconductor element electrically connected to the redistribution layer of the first redistribution structure and an encapsulant disposed on the first protection layer to cover the semiconductor element.

14. The device structure of claim 9, wherein the dielectric material covers a portion of the metal layer.

15. The device structure of claim 9, wherein the device structure includes a capacitor, a substrate or a package structure.

16. The device structure of claim 1, wherein a tapering direction of the electrode via is the same as a tapering direction of the dielectric material.

17. The device structure of claim 1, further comprising a plurality of first inner vias extending through the first dielectric structure and electrically connected to the first electrode structure.

18. The device structure of claim 17, wherein a tapering direction of each of the first inner vias is the same as a tapering direction of the electrode via.

19. The device structure of claim 17, further comprising a plurality of outer vias extending through the stacked structure and electrically connected to the first inner vias.

* * * * *